(12) United States Patent
Hemink

(10) Patent No.: US 8,054,691 B2
(45) Date of Patent: Nov. 8, 2011

(54) DETECTING THE COMPLETION OF PROGRAMMING FOR NON-VOLATILE STORAGE

(75) Inventor: Gerrit Jan Hemink, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 300 days.

(21) Appl. No.: 12/492,421

(22) Filed: Jun. 26, 2009

(65) Prior Publication Data
US 2010/0329004 A1   Dec. 30, 2010

(51) Int. Cl.
*G11C 11/34* (2006.01)
(52) U.S. Cl. ............... 365/185.22; 365/185.18; 365/236
(58) Field of Classification Search ............ 365/185.22, 365/185.18, 236
See application file for complete search history.

(56) References Cited

U.S. PATENT DOCUMENTS

| | | | |
|---|---|---|---|
| 5,909,449 A | 6/1999 | So | |
| 6,185,134 B1 | 2/2001 | Tanaka | |
| 6,418,059 B1 * | 7/2002 | Kreifels et al. | 365/185.28 |
| 6,888,758 B1 | 5/2005 | Hemink | |
| 6,944,072 B2 | 9/2005 | Micheloni | |
| 7,196,928 B2 | 3/2007 | Chen | |
| 7,295,478 B2 | 11/2007 | Wan | |
| 7,304,893 B1 | 12/2007 | Hemink | |
| 7,434,111 B2 | 10/2008 | Sugiura | |
| 7,440,319 B2 | 10/2008 | Li | |
| 2003/0123286 A1 | 7/2003 | Higuchi | |
| 2004/0109362 A1 | 6/2004 | Gongwer | |
| 2004/0257888 A1 | 12/2004 | Noguchi | |
| 2005/0125708 A1 | 6/2005 | Simon | |
| 2005/0157552 A1 | 7/2005 | Hemink | |
| 2007/0226592 A1 | 9/2007 | Radke | |
| 2008/0016392 A1 | 1/2008 | Earl | |
| 2008/0072120 A1 | 3/2008 | Radke | |

(Continued)

FOREIGN PATENT DOCUMENTS
WO    WO9828745    7/1998

(Continued)

OTHER PUBLICATIONS

Nonvolatile Memory and Method With Reduced Program Verify by Ignoring Fastest and/or Slowest Programming Bits, Inventors: Li et al., U.S. Appl. No. 12/249,678, filed Oct. 10, 2008.

(Continued)

*Primary Examiner* — Son Dinh
*Assistant Examiner* — Nam Nguyen
(74) *Attorney, Agent, or Firm* — Vierra Magen Marcus & DeNiro LLP

(57) ABSTRACT

A set of non-volatile storage elements are subjected to a programming process in order to store data. During the programming process, one or more verification operations are performed to determine whether the non-volatile storage elements have reached their target condition to store the appropriate data. Programming can be stopped when all non-volatile storage elements have reached their target level or when the number of non-volatile storage elements that have not reached their target level is less than a number or memory cells that can be corrected using an error correction process during a read operation (or other operation). The number of non-volatile storage elements that have not reached their target level can be estimated by counting the number of non-volatile storage elements that have not reached a condition that is different (e.g., lower) than the target level.

23 Claims, 18 Drawing Sheets

U.S. PATENT DOCUMENTS

| | | |
|---|---|---|
| 2008/0104312 A1 | 5/2008 | Lasser |
| 2008/0198662 A1 | 8/2008 | Mokhlesi |
| 2008/0250300 A1 | 10/2008 | Mokhlesi |

FOREIGN PATENT DOCUMENTS

| | | |
|---|---|---|
| WO | WO2005041206 | 5/2005 |
| WO | WO2006138413 | 12/2006 |

OTHER PUBLICATIONS

PCT International Search Report dated Sep. 17, 2010, PCT Patent Appl. PCT/US2010/037846.

PCT Written Opinion of the International Searching Authority dated Sep. 17, 2010, PCT Patent Appl. PCT/US2010/037846.

* cited by examiner

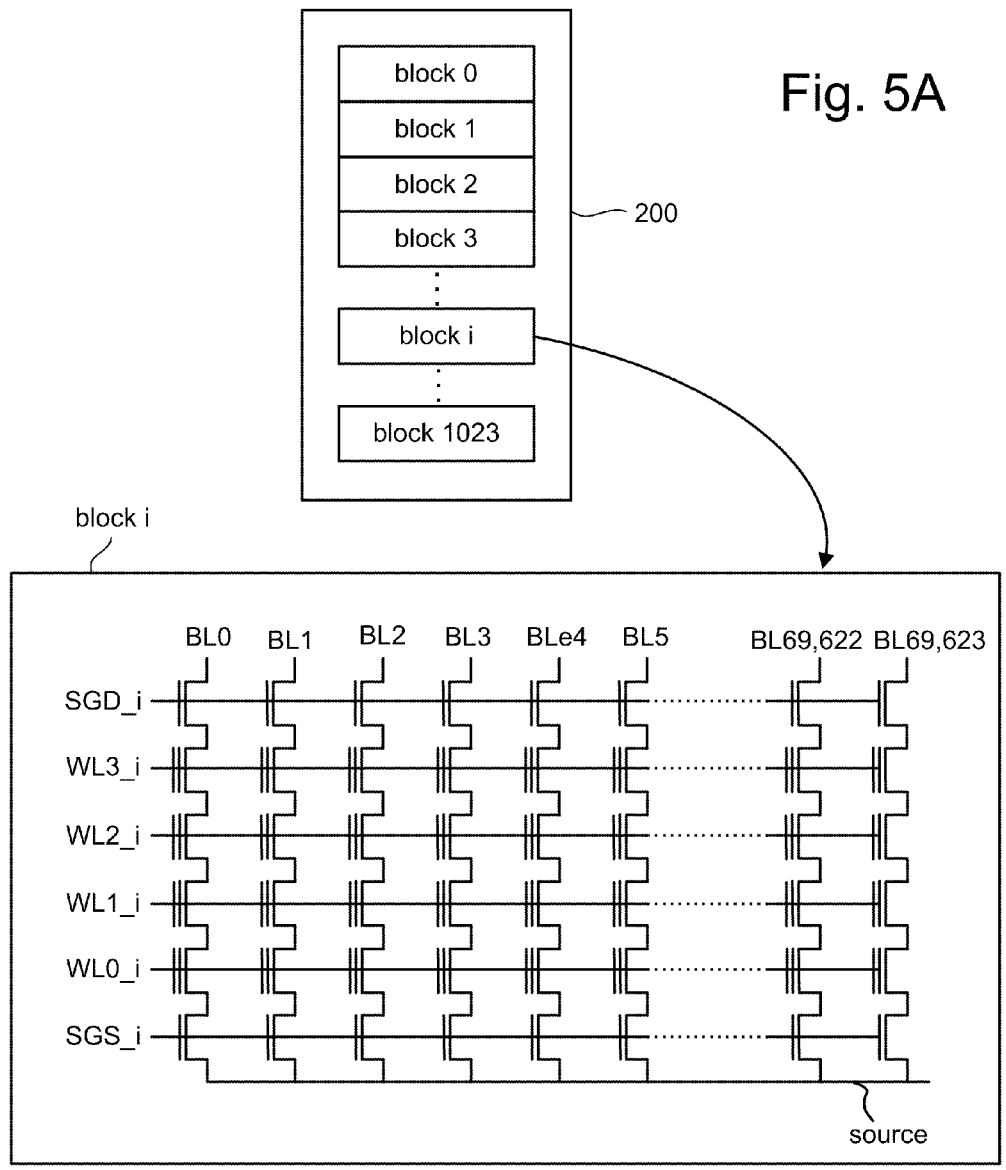
Fig. 5A
Fig. 5B
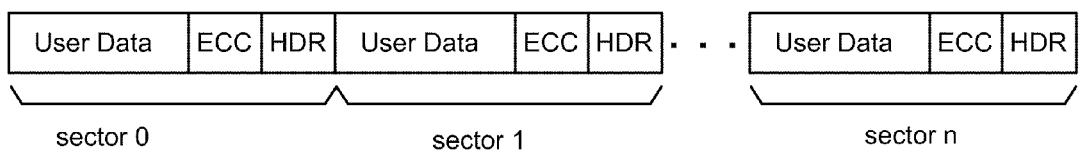

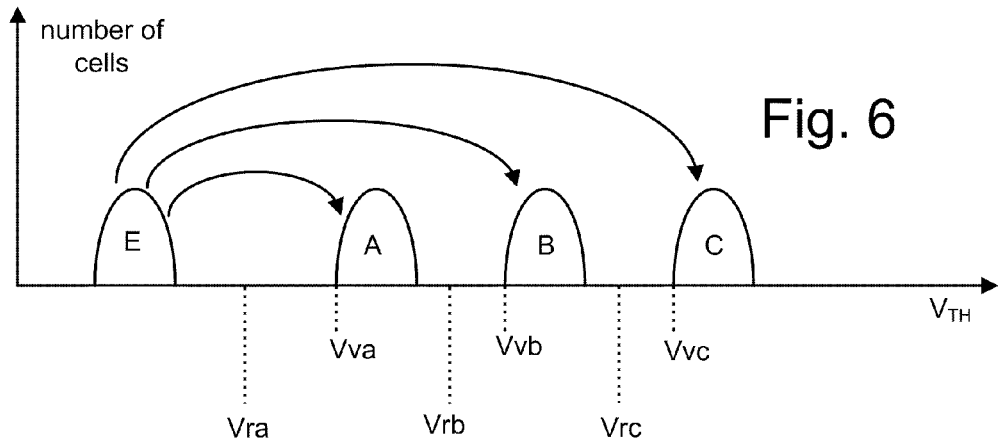
Fig. 6
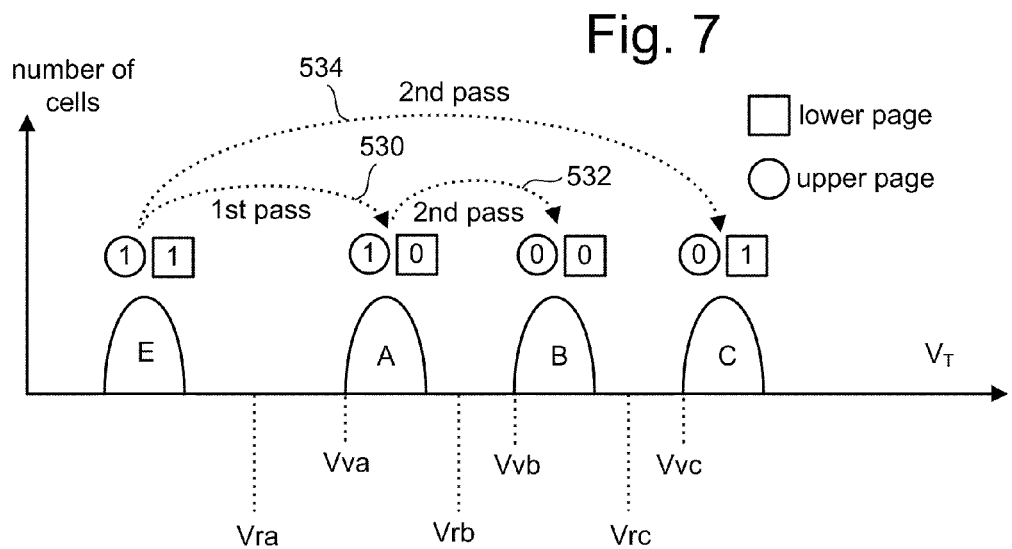
Fig. 7
| Wordline | Upper/ Lower Page | All Bit Lines |
|---|---|---|
| WL3 | upper | Page 7 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |
Fig. 9

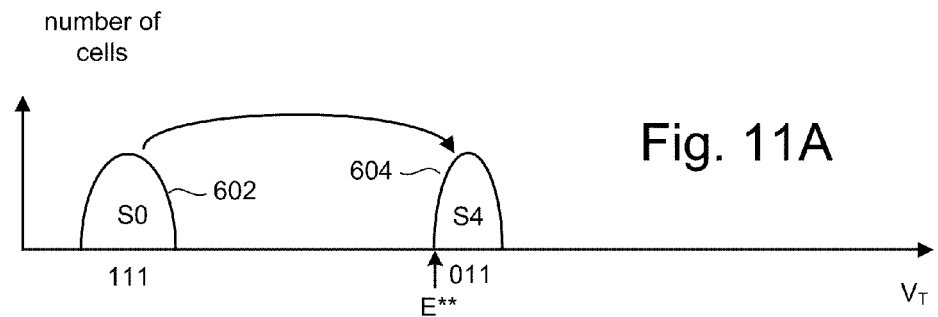
Fig. 11A
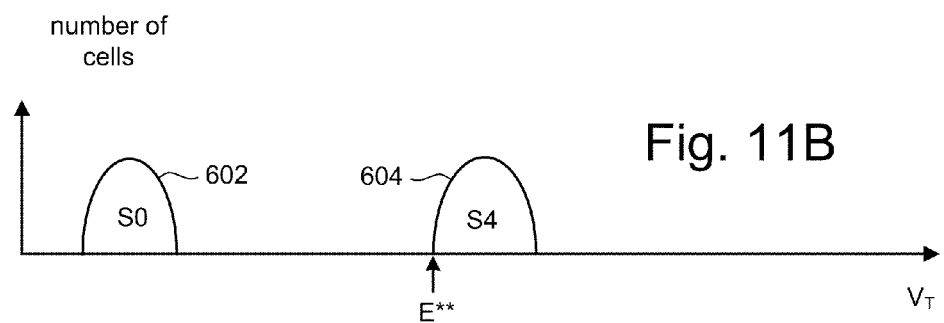
Fig. 11B
Fig. 11C
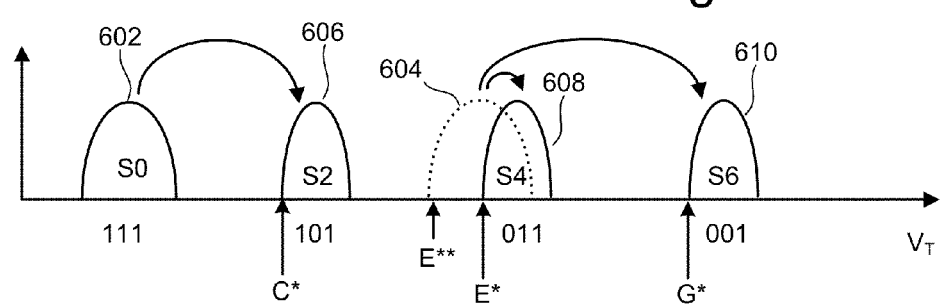
Fig. 11D
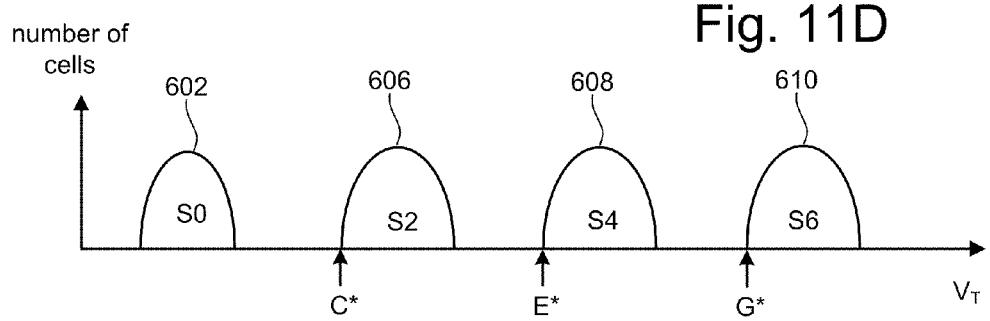

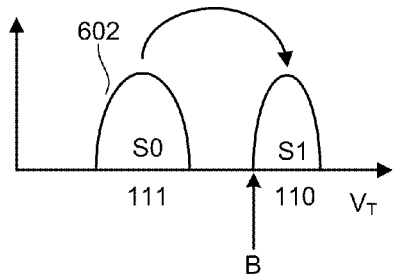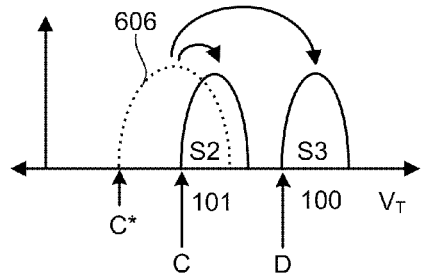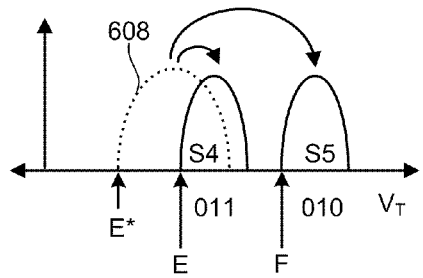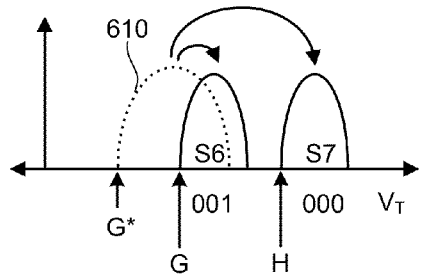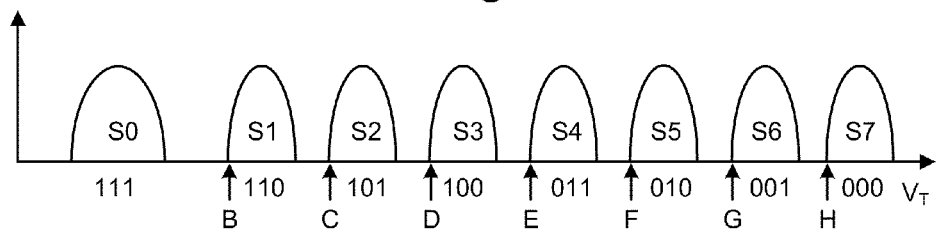

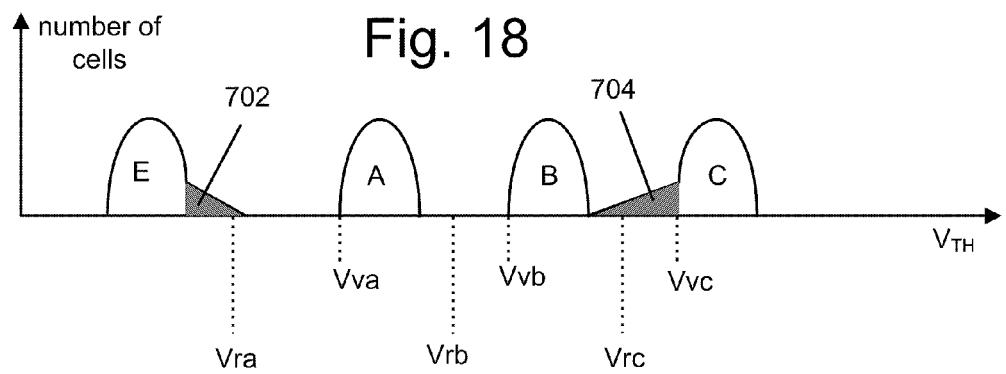
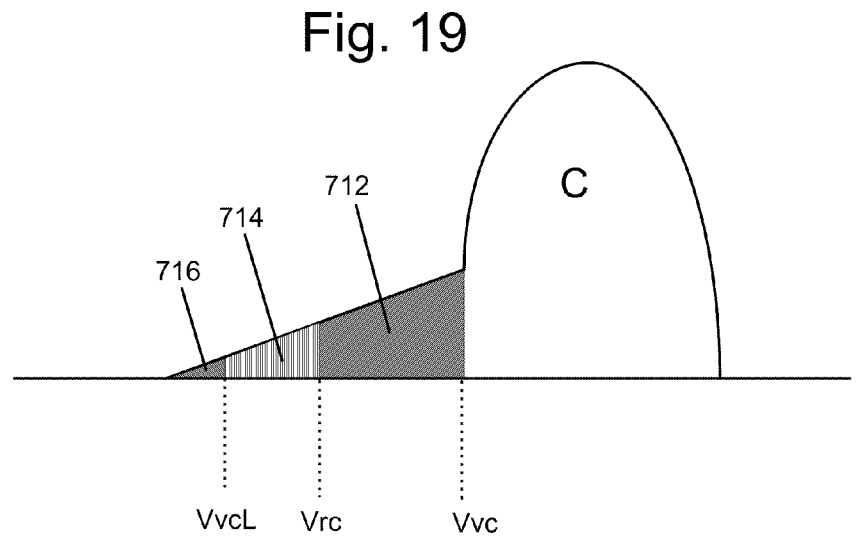

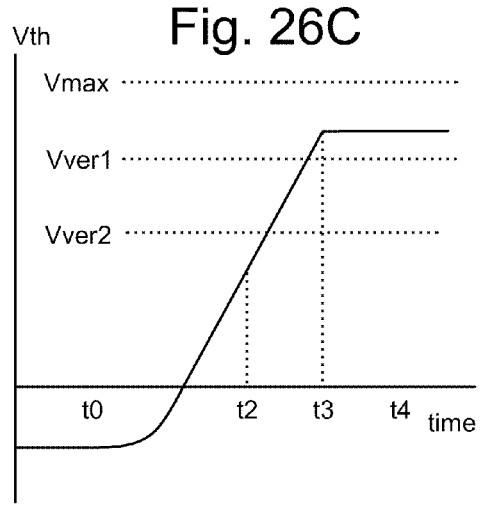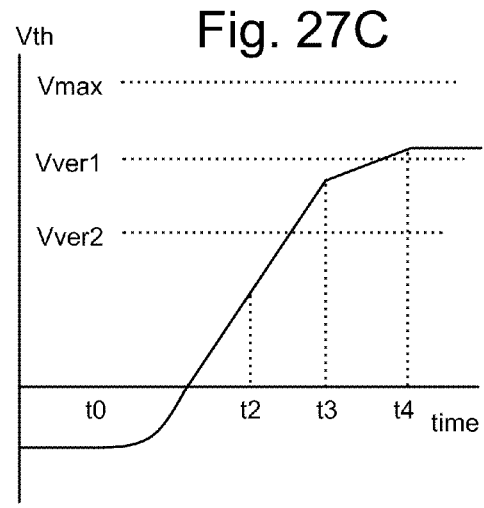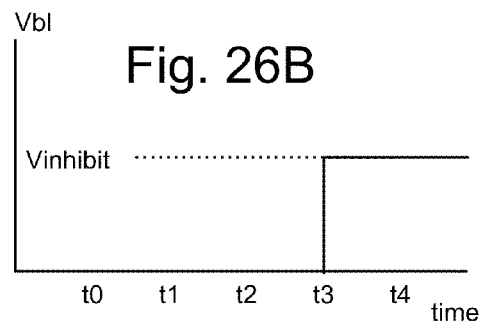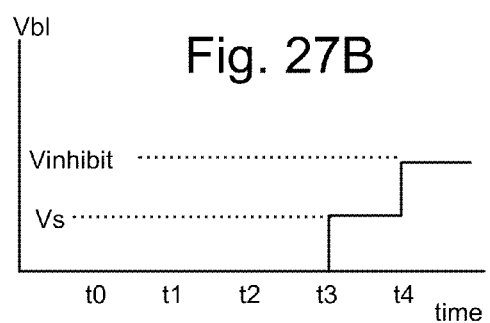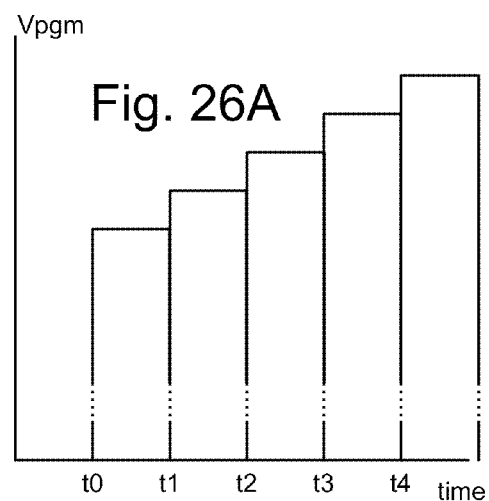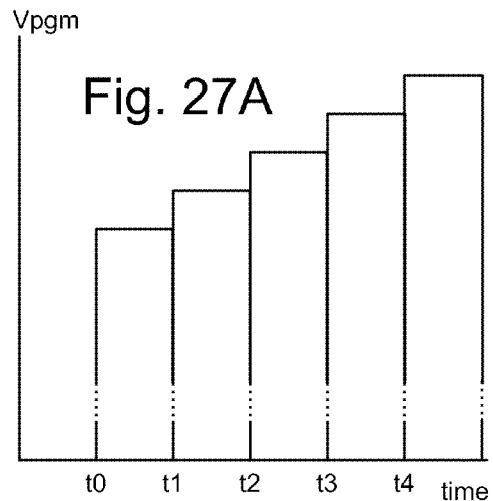

US 8,054,691 B2

DETECTING THE COMPLETION OF PROGRAMMING FOR NON-VOLATILE STORAGE

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2v, 0.3v, 0.4v, or others). Between pulses, the memory system will verify whether the individual memory cells have reached their respective target threshold voltage ranges. Those memory cells that have reached their target threshold voltage range will be locked out of future programming (e.g., by raising the bit line voltage to Vdd). When all memory cells have reached their target threshold voltage range, programming is complete.

BRIEF DESCRIPTION OF THE DRAWINGS

FIG. 5A is a block diagram depicting one embodiment of a memory array.

FIG. 5B depicts a page of data.

FIG. 6 depicts an example set of threshold voltage distributions and describes a process for programming non-volatile memory.

FIG. 7 depicts an example set of threshold voltage distributions and describes a process for programming non-volatile memory.

FIG. 9 is a table depicting the order of programming non-volatile memory in one embodiment.

FIGS. 11A-I show various threshold voltage distributions and describe a process for programming non-volatile memory.

FIG. 18 depicts an example set of threshold voltage distributions.

FIG. 19 depicts one example threshold voltage distribution.

FIGS. 26A, B and C depict a one embodiment of a programming process that is performed as part of coarse/fine programming.

FIGS. 27A, B and C depict a one embodiment of a programming process that is performed as part of coarse/fine programming.

DETAILED DESCRIPTION

In a non-volatile storage system, a set non-volatile storage elements are subjected to a programming process in order to store a set of data. Programming can be stopped when all non-volatile storage elements have reached their target level or when the number of non-volatile storage elements that have not reached their target level is less than a number of memory cells that can be corrected using an error correction process during a read operation (or other operation). The number of non-volatile storage elements that have not reached their target level can be estimated by counting the number of non-volatile storage elements that have not reached a condition that is different than the target level.

Figure 1:
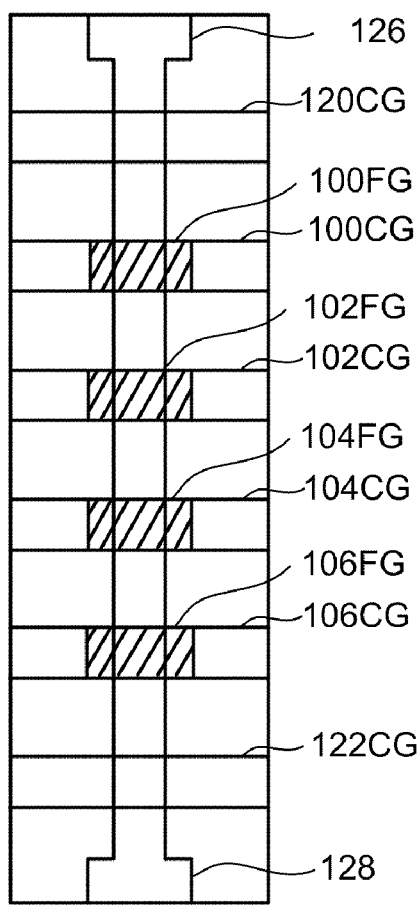
FIG. 1 is a top view of a NAND string.
Figure 2:
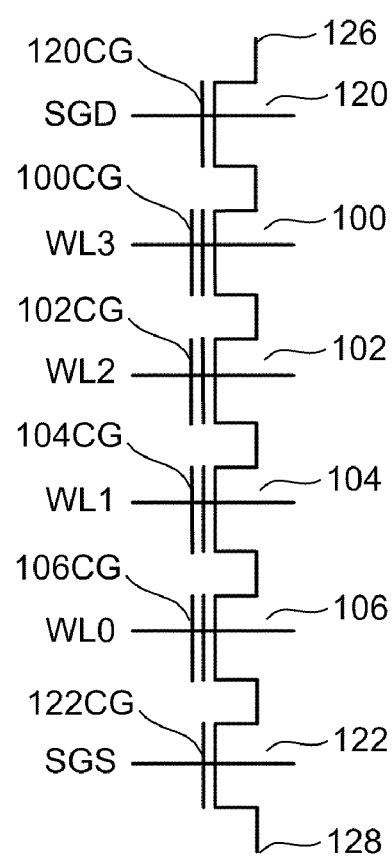
FIG. 2 is an equivalent circuit diagram of the NAND string.

One example of a non-volatile storage system is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 491-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of memory devices can also be used.

Figure 3:
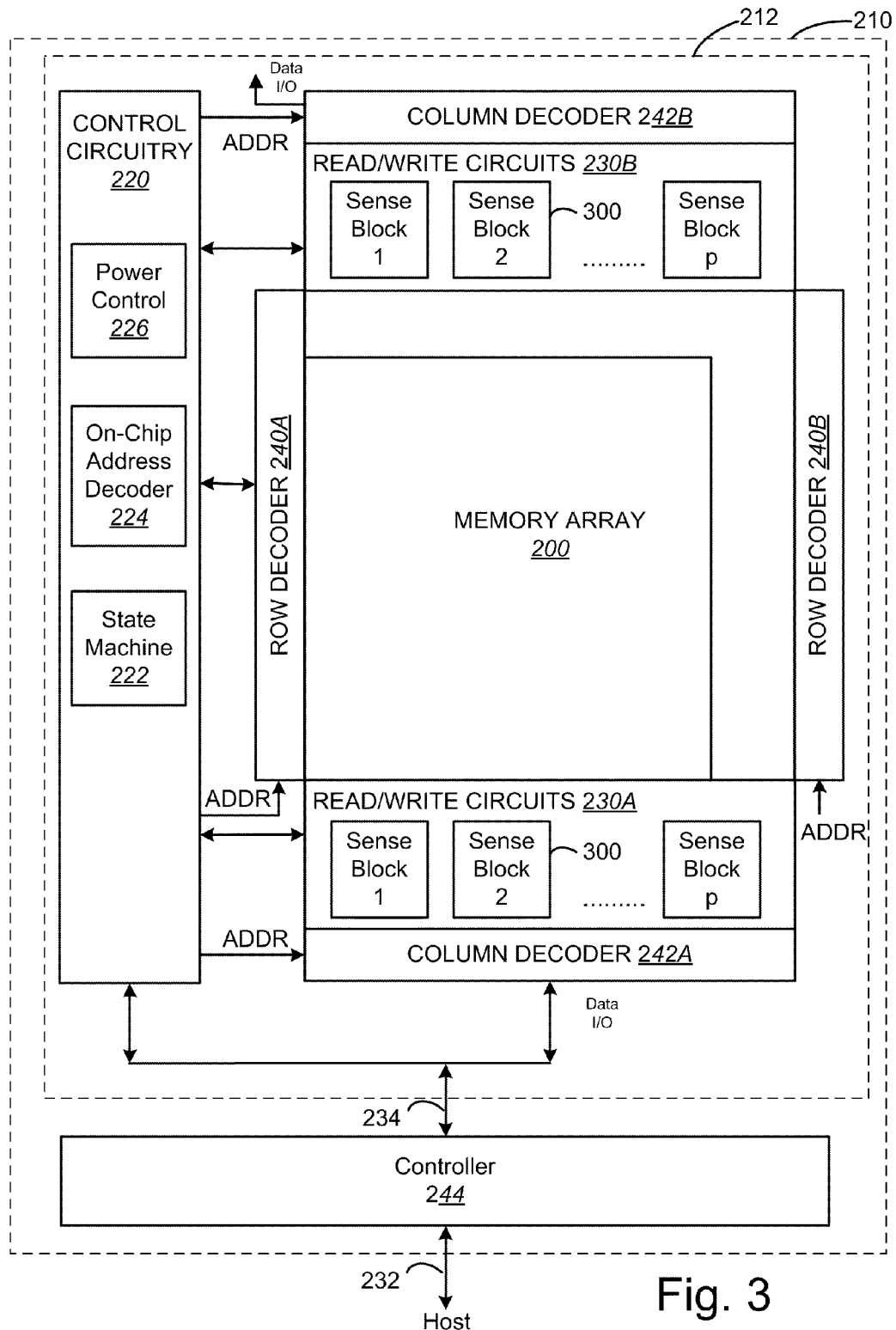
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, the decoders 240 A/B & 242A/B, the read/write circuits 230A/B and the controller 244, collectively or separately, can be referred to as one or more managing circuits.

Figure 4:
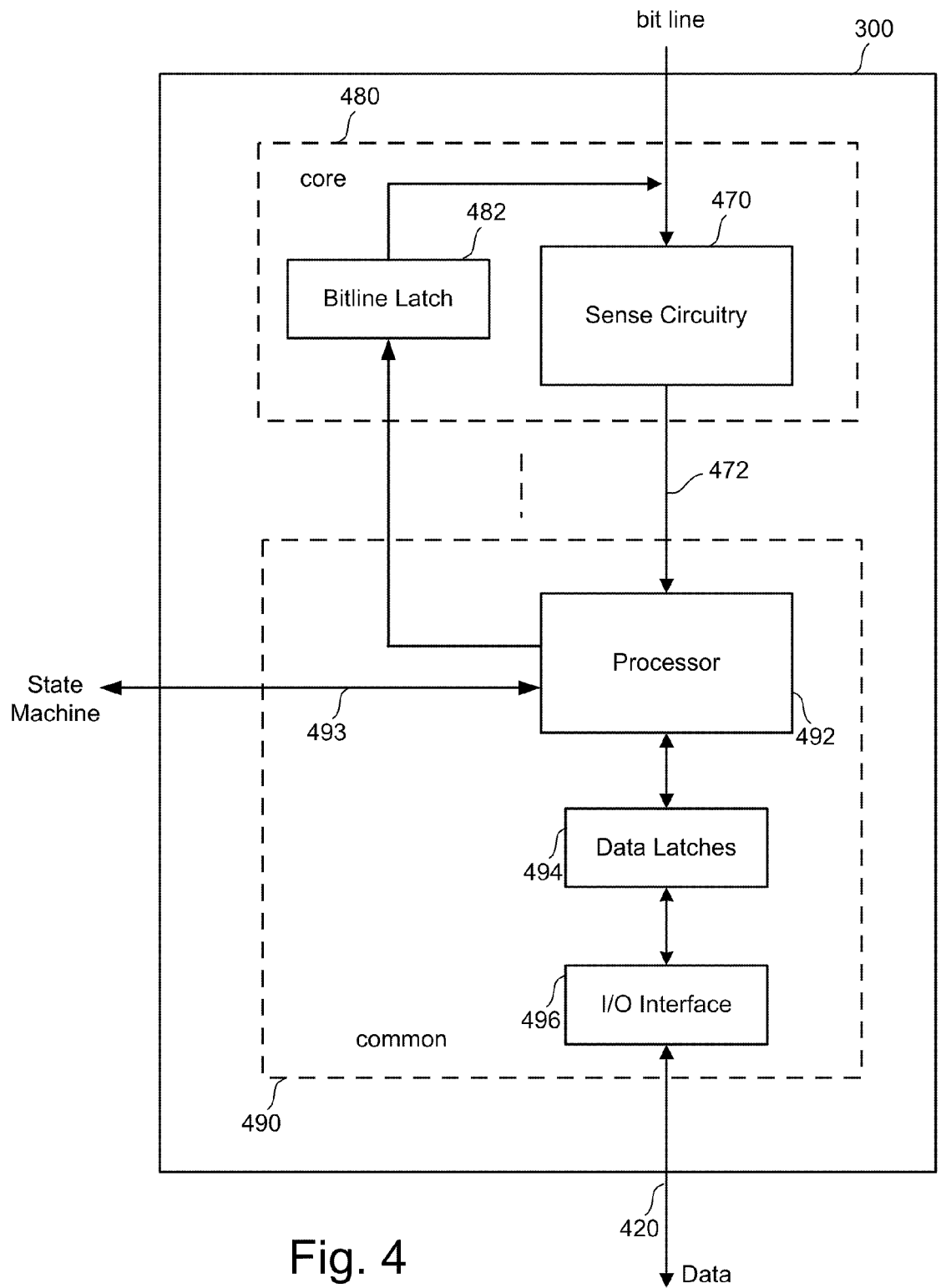
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory," Inventors Siu Lung Chan and Raul-Adrian Cemea, filed on Dec. 28, 2005. All five of the immediately above-listed patent documents are incorporated herein by reference in their entirety.

FIG. 5A depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together.

As one example, a NAND flash EEPROM is depicted in FIG. 5A that is partitioned into 1,024 blocks. However, more or less than 1024 blocks can be used. In each block, in this example, there are 69,624 columns corresponding to bit lines BL0, BL1, . . . BL69,623. In one embodiment, all the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5A shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. FIG. 5B depicts data for a page. Depending on the size of the page, the page contains many sectors. Each sector includes user data, error correction codes (ECC), and header information.

In some memory systems utilizing multi-state memory cells, each bit of data in a memory cell is in a different page. For example, if an array of memory cells store three bits of data (eight states or levels of data) per memory cell, each memory cell stores data in three pages with each of the three bits being on a different page. Thus, within a block in this example, each word line is associated with three pages or an integer multiple of three pages. Other arrangements are also possible.

The use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words to include the actual data and the additional code bits, using a selected code. Retrieval of the stored data involves the decoding of the stored code words according to the same code as used to encode the stored code words. Because the code bits "over-specify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as ½).

Some memory cells are slower to program or erase than others because of manufacturing variations among those cells, because those cells were previously erased to a lower threshold voltage than others, because of uneven wear among the cells within a page, or other reasons. And, of course, some cells cannot be programmed or erased whatsoever, because of a defect or other reason. As mentioned above, error correction coding provides the capability of tolerating some number of slow or failed cells, while still maintaining the memory as usable. In some applications, a page of data is programmed by repeatedly applying programming pulses until all memory cells on that page verify to the desired programmed state. In these applications, programming terminates if a maximum number of programming pulses is reached prior to successful verifying of the programmed page, following which the number of cells that have not yet been verified to the desired state is compared with a threshold value, which depends on the capability of the error correction coding that will be used in the reading of data from that page. In other applications in which the error correction is sufficiently robust, programming and erasing time is saved by terminating the sequence of programming or erasing pulses when the number of slow (or error) cells that are not yet fully programmed or erased is fewer than the number of bits that are correctable.

Error correction is typically performed on a sector-by-sector basis. Thus, each sector will have its own set of ECC codes. This error correction is convenient and useful because, in one embodiment, the sector is the desired unit of data transfer to and from the host system.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions for the memory cell array when each memory cell stores two bits of data. Other embodiments, however, may use more or less than two bits of data per memory cell (e.g., such as three bits of data per memory cell). FIG. 6 shows a first threshold voltage distribution E for erased memory cells. Three threshold voltage distributions, A, B and C for programmed memory cells are also depicted. In one embodiment, the threshold voltages in the distribution E are negative and the threshold voltages in the A, B and C distributions are positive. As can be seen, threshold voltage distribution A is the lowest of A, B and C. Threshold voltage distribution C is the highest of A, B and C.

Each distinct threshold voltage range of FIG. 6 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 shows three read reference voltages, Vra, Vrb and Vrc, for reading data from memory cells. By testing whether the threshold voltage of a given memory cell is above or below Vra, Vrb and Vrc, the system can determine what state the memory cell is in. That is, by knowing whether a memory cell turns on in response to Vra, Vrb and Vrc, the processor can figure out which state the memory cell is in. For example, when reading a memory cell, if the memory cell turns on in response to receiving Vrc but does not turn on in response to Vrb, then the memory cell is in state B.

FIG. 6 also shows three verify reference voltages Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In general, during verify operations and read operations, the selected word line is connected to a voltage, a level of which is specified for each read operation (e.g., see read compare levels Vra, Vrb, and Vrc, of FIG. 6) or verify operation (e.g. see verify levels Vva, Vvb, and Vvc of FIG. 6) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

In one embodiment, known as full sequence programming, memory cells can be programmed from the erased state E directly to any of the programmed states A, B or C. For example, a population of memory cells to be programmed may first be erased so that all memory cells in the population are in erased state E. While a first set of memory cells is being programmed from state E to state A, a second set of memory cells is being programmed from state E to state B and a third set of memory cells is being programmed from state E to state C. Full sequence programming is graphically depicted by the three curved arrows of FIG. 6.

FIG. 7 illustrates an example of a two-pass technique of programming a multi-state memory cell that stores data for two different pages: a lower page and an upper page. Four states (threshold voltage distributions) are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the memory cell's threshold voltage level is set according to the data bit to be programmed into the lower logical page. If that data bit is a logic "1," the threshold voltage is not changed since it is in the appropriate state as a result of having been earlier erased. However, if the data bit to be programmed is a logic "0," the threshold level of the cell is increased to be state A, as shown by arrow 530.

In a second programming pass, the memory cell's threshold voltage level is set according to the data bit being programmed into the upper logical page. If the upper logical page bit is to store a logic "1," then no programming occurs since the cell is in one of the states E or A, depending upon the programming of the lower page bit, both of which carry an upper page bit of "1." If the upper page data bit is to be a logic "0," then the threshold voltage is shifted. If the first pass resulted in the memory cell remaining in the erased state E, then in the second phase the memory cell is programmed so that the threshold voltage is increased to be within state C, as depicted by arrow 534. If the memory cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page.

In one embodiment, a system can be set up to perform full sequence writing if enough data is written to fill up a word line. If not enough data is being written, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Pub. No. 2006/0126390, Ser. No. 11/013,125, filed on Dec. 14, 2004, inventors Sergy Anatolievich Gorobets and Yan Li, incorporated herein by reference in its entirety.

Figure 8A:
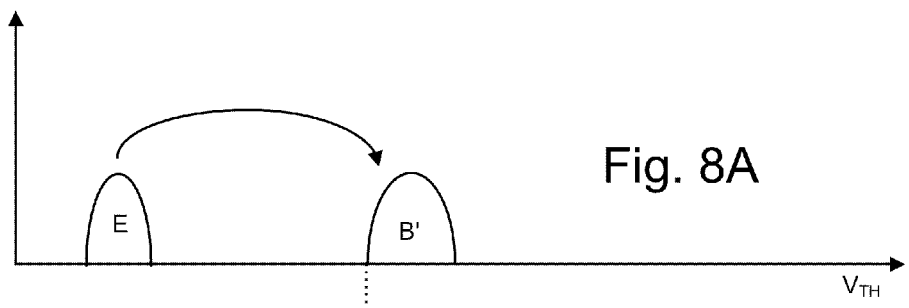
FIGS. 8A-C show various threshold voltage distributions and describe a process for programming non-volatile memory.
Figure 8B:
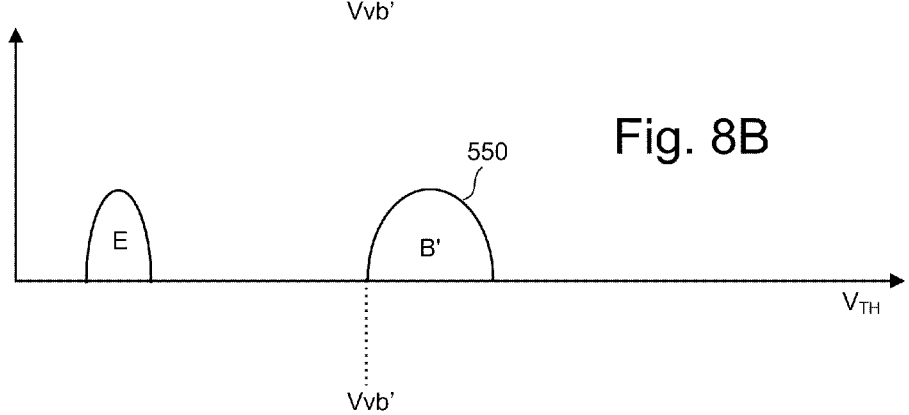
Figure 8C:
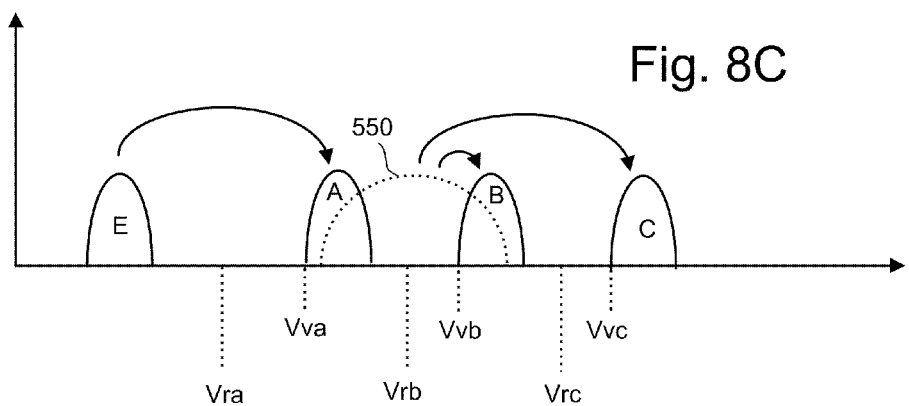

FIGS. 8A-C disclose another process for programming non-volatile memory that reduces the effect of floating gate to floating gate coupling. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two data in two pages. For reference purposes these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0.

The programming process of FIGS. 8A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell (on word line WLn is programmed from state E to state B', its neighbor memory cell (on word line WLn+1) on the NAND string will then be programmed with respect to its lower page. For example, after the lower page for a memory cell connected to WL0 is programmed, the lower page for a memory cell (the neighbor memory cell) on the same NAND string but connected to WL1 can be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted by threshold voltage distribution 550 in FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 8A-C reduces the effect of coupling between floating gates because only the upper page programming of neighbor memory cells will have an effect on the apparent threshold voltage of a given memory cell.

Although FIGS. 8A-C provide an example with respect to four data states and two pages of data, the concepts taught by FIGS. 8A-C can be applied to other implementations with more or less than four states, different than two pages, and/or other data encodings.

FIG. 9 is a table that describes one embodiment of the order for programming memory cells utilizing the programming method of FIGS. 8A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

Figure 10:
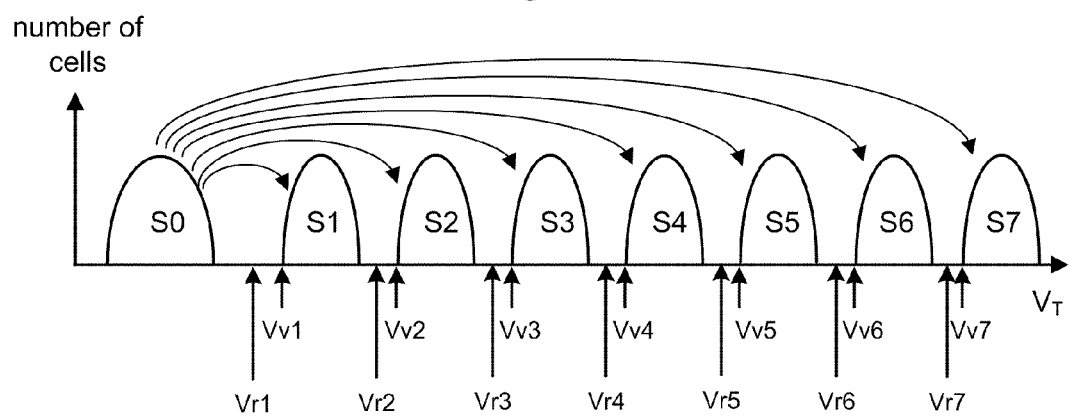
FIG. 10 depicts an example set of threshold voltage distributions and describes a process for programming non-volatile memory.

FIG. 10 illustrates example threshold voltage distributions (also called data states) for the memory cell array when each memory cell stores three bits of multi-state data. Other embodiment, however, may use more or less than three bits of data per memory cell (e.g., such as four or more bits of data per memory cell).

In the example of FIG. 10, each memory cell stores three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

In one embodiment, S0 is for erased memory cells. Data is programmed from S0 to S1-S7. As can be seen from FIG. 10, of S1-S7, S1 is the lowest in magnitude and S7 is the highest in magnitude (e.g. most extreme).

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 10

FIG. 10 shows a set of target verify levels Vv1, Vv2, Vv3, Vv4, Vv5, Vv6, and Vv7. These target verify levels are used as comparison levels during the programming process. For example, when programming memory cells to state 1, the system will check to see if the threshold voltages of the memory cells has reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Target verify level Vv2 is used for memory cells being programmed to state 2. Target verify level Vv3 is used for memory cells being programmed to state 3. Target verify level Vv4 is used for memory cells being programmed to state 4. Target verify level Vv5 is used for memory cells being programmed to state 5. Target verify level Vv6 is used for memory cells being programmed to state 6. Target verify level Vv7 is used for memory cells being programmed to state 7.

FIG. 10 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

FIGS. 11A-11I disclose another process for programming multi-state data. Prior to the first step, the memory cells will be erased so that they are in the erase threshold distribution of state S0. The process of FIGS. 11A-11I assumes that each memory cell stores three bits of data, with each bit for a given memory cell being in a different page. The first bit of data (the leftmost bit) is associated with the first page. The middle bit is associated with the second page. The rightmost bit is associated with the third page. In one embodiment, the correlation of data states to data is as follows: S0=111, S1=110, S2=101, S3=100, S4=011, S5=010, S6=001 and S7=000. However, other embodiments can use other data encoding schemes.

When programming the first page (as described in FIG. 11A), if the bit is to be data "1" then the memory cell will stay in state S0 (threshold voltage distribution 602). If the bit is to be data "0" then the memory cell is programmed to state S4 (threshold voltage distribution 604). After adjacent memory cells are programmed, capacitive coupling between adjacent floating gates may cause the state S4 to widen as depicted in FIG. 11B. State S0 may also widen, but there is sufficient margin between S0 and S1 to ignore the effect. More information about capacitive coupling between adjacent floating gates can be found in U.S. Pat. No. 5,867,429 and U.S. Pat. No. 6,657,891, both of which are incorporated herein by reference in their entirety.

When programming the second page (see FIG. 11C), if the memory cell is in state S0 and the second page bit is data "1" then the memory cell stays in state S0. In some embodiments, the programming process for the second page will tighten threshold voltage distribution 602 to a new S0. If the memory cell was in state S0 and the data to be written to the second page is "0," then the memory cell is moved to state S2 (threshold voltage distribution 606). State S2 has a verify point of C*. If the memory cell was in state S4 and the data to be written to the memory cell is "1" then the memory cell remains in S4. However, state S4 is tightened by moving the memory cells from threshold voltage distribution 604 to threshold voltage distribution 608 for state S4, as depicted in FIG. 11C. Threshold voltage distribution 608 has a verify point of E* (as compared to E** of threshold voltage distribution 604). If the memory cell is in state S4 and the data to be written to the second page is a "0" then the memory cell has its threshold voltage moved to state S6 (threshold voltage distribution 610), with a verify point of G*.

After the adjacent memory cells are programmed, states S0, S2, S4 and S6 are widened due to the floating gate to floating gate coupling, as depicted by threshold voltages distributions 602, 606, 608 and 610 of FIG. 11D.

FIGS. 11E, 11F, 11G and 11H depict the programming of the third page. While one graph can be used, the programming process is depicted in four graphs for visibility reasons. After the second page has been programmed, the memory cells are either in states S0, S2, S4 or S6. FIG. 11E shows the memory cells that are in state S0 being programmed for the third page. FIG. 11F shows the memory cells that are in state S2 being programmed for the third page. FIG. 11G shows the memory cells that are in state S4 being programmed for the third page. FIG. 11H shows the memory cells that are in state S6 being programmed for the third page. FIG. 11I shows the threshold voltage distributions after the processes of FIGS. 11E, 11F, 11G and 11H have been performed on the population of memory cells (concurrently or serially).

If a memory cell is in state S0 and the third page data is "1" then the memory cell remains at state S0. If the data for the third page is "0" then the threshold voltage for the memory cell is raised to be in state S1, with a verify point of B (see FIG. 11E).

If a memory cell is in state S2 and the data to be written in the third page is "1," then the memory cell will remain in state S2 (see FIG. 11F). However, some programming will be performed to tighten the threshold distribution 606 to a new state S2 with a verify point of C. If the data to be written to the third page is "0," then the memory cell will be programmed to state S3, with a verify point of D.

If a memory cell is in state S4 and the data to be written to the third page is "1" then the memory cell will remain in state S4 (see FIG. 11G). However, some programming will be performed so that threshold voltage distribution 608 will be tightened to new state S4 with a verify point of E. If a memory cell is in state S4 and the data to be written to the third page is "0" then the memory cell will have its threshold voltage raised to be in state S5, with a verify point of F (see FIG. 11G).

If the memory cell is in state S6 and the data to be written to the third page is "1" then the memory cell will remain in state S6 (see FIG. 11H). However, there will be some programming so that the threshold voltage distribution 510 is tightened to be in new state S6, with a verify point at G. If the third page data is "0" then the memory cell will have its threshold voltage programmed to state S7, with a verify point at H (see FIG. 11H). At the conclusion of the programming of the third page, the memory cell will be in one of the eight states depicted in FIG. 11I.

Figure 12:
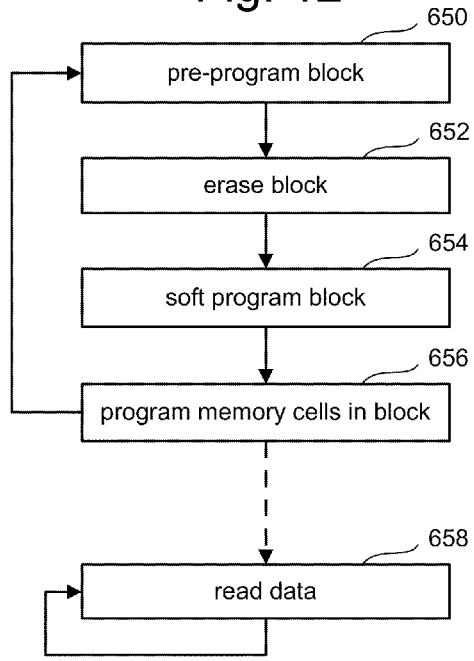
FIG. 12 is a flow chart describing one embodiment of a process for operating non-volatile memory.

FIG. 12 is a flow chart describing a process for operating memory cells connected to a selected word line. In one embodiment, the process of FIG. 12 is used to program a block of memory cells. In one implementation of the process of FIG. 12, memory cells are pre-programmed in order to maintain even wear on the memory cells (step 650). In one embodiment, the memory cells are preprogrammed to the highest state, a random pattern, or any other pattern. In some implementations, pre-programming need not be performed.

In step 652, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state E or S0. One implementation of an erase process includes applying several erase pulses to the p-well and verifying between erase pulses whether the NAND strings are properly erased.

At step 654, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution (e.g., state E or S0).

In step 656, the memory cells of the block are programmed. After programming, the memory cells of the block can be read (step 658). Many different read processes known in the art can be used to read data. In some embodiments, the read process includes using ECC to correct errors. The data read, is output to the hosts that requested the read operation. The ECC process can be performed by the state machine, the controller or another device.

FIG. 12 shows that the erase-program cycle can happen many times without or independent of reading, the read process can occur many times without or independent of programming, and the read process can happen any time after programming. The process of FIG. 12 can be performed at the direction of the state machine using the various circuits described above. In other embodiments, the process of FIG. 12 can be performed at the direction of the controller using the various circuits described above.

Figure 13:
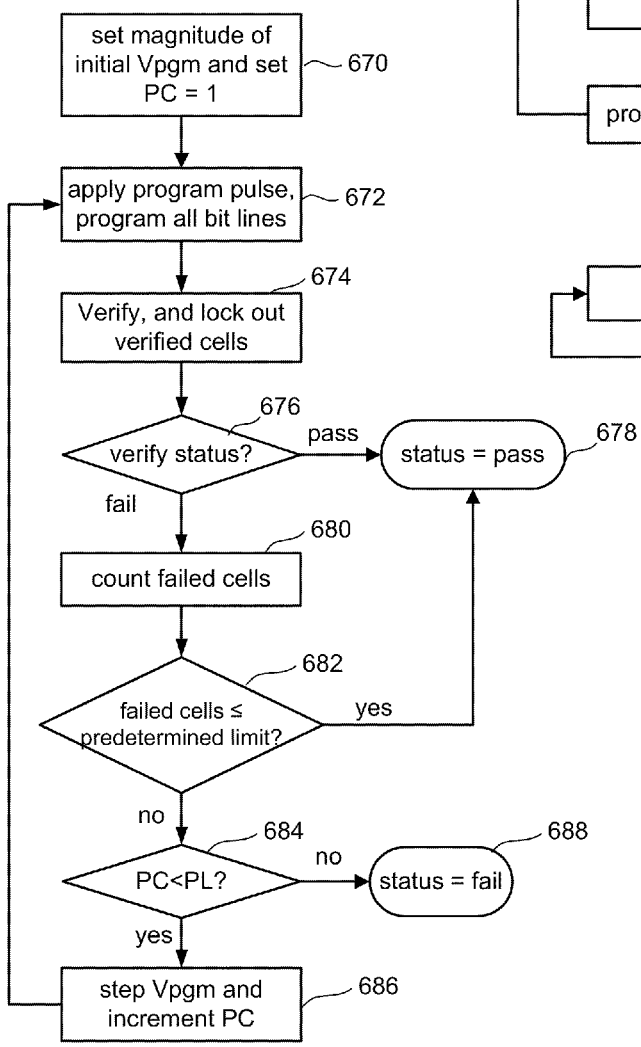
FIG. 13 is a flow chart describing one embodiment of a process for programming non-volatile memory.

FIG. 13 is a flow chart describing one embodiment of a process for performing programming on memory cells connected to a common word line to one or more target conditions (e.g., data states or threshold voltage ranges). The process of FIG. 13 can be performed one or multiple times during step 656 of FIG. 12. For example, the process of FIG. 13 can be used to program memory cells (e.g., full sequence programming) from state E or S0 directly to any of states A-C (see FIG. 6) or S1-S7 (see FIG. 10). Alternatively, the process of FIG. 13 can be used to perform one or each of the phases of the process of FIG. 7, one or each of the steps of the process of FIGS. 8A-C, or one or each of the steps of the process of FIGS. 11A-I. For example, when performing the process of FIG. 7, the process of FIG. 13 is used to implement the first phase that includes programming some of the memory cells from state E to state A. The process of FIG. 13 can then be used again to implement the second phase that includes programming some of the memory cells from state E to state C while programming other memory cells from state A to state B.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 670 of FIG. 13, the programming voltage (Vpgm) is initialized to the starting magnitude (e.g., ~12-16V or another suitable level) and a program counter PC maintained by state machine 222 is initialized at 1. In step 672, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 672, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 674, the states of the selected memory cells are verified using the appropriate set of target levels. Step 674 includes performing one or more verify operations. If it is detected that the threshold voltage of a memory cell has reached the appropriate target level, then that memory cell is locked out of further programming by, for example, raising its bit line voltage to Vdd during subsequent programming pulses.

In step 676, it is checked whether all the memory cells have reached their target threshold voltages. If so, the programming process is complete and successful because all selected memory cells were programmed and verified to their target states. A status of "PASS" is reported in step 678. If, in 676, it is determined that not all of the memory cells have reached their target threshold voltages, then the programming process continues to step 680.

In step 680, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference. In another alternative, each of the sense amplifiers can output an analog voltage or current if its corresponding cell has failed and an analog voltage or current summing circuit can be used to count the number of cells that have failed.

In one embodiment, there is one total counted, which reflects the total number of memory cells currently being programmed that have failed the last verify step. In another embodiment, separate counts are kept for each data state.

In step 682, it is determined whether the count from step 680 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 678. In this situation, enough memory cells programmed correctly such that the few remaining memory cells that have not been completely programmed can be corrected using ECC during the read process (see step 658 of FIG. 12).

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 684 and the program counter PC is checked against the program limit value (PL). One example of a program limit value is 20; however, other values can be used. If the program counter PC is not less than the program limit value PL, then the program process is considered to have failed and a status of FAIL is reported in step 688. If the program counter PC is less than the program limit value PL, then the process continues at step 686 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 686, the process loops back to step 672 and another program pulse is applied to the selected word line.

Figure 14:
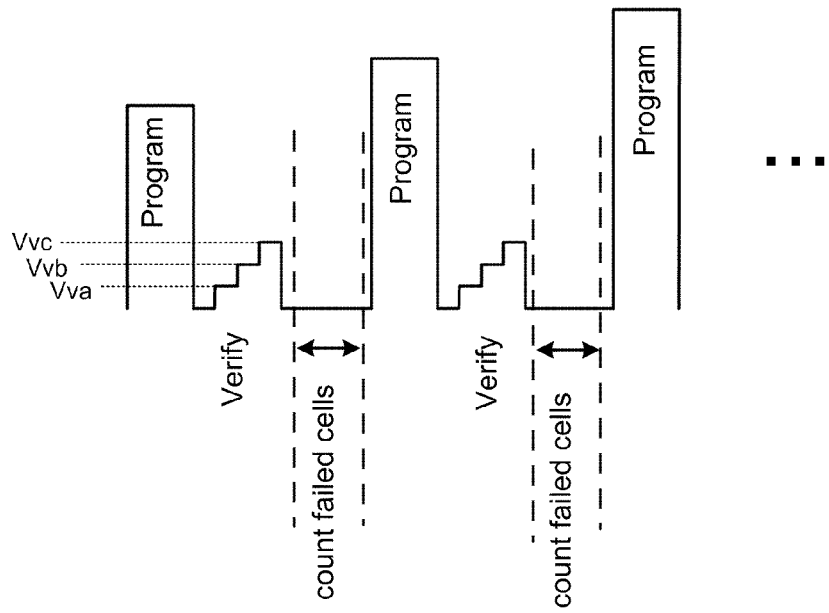
FIGS. 14-17 depicts a control gate signal for one embodiment of non-volatile memory.

FIG. 14 shows a portion of the voltage waveform applied to the selected word line and, therefore, to the control gates of the memory cells connected to the selected word line during the programming for the process of FIG. 13. The waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. The example of FIG. 14 corresponds to the embodiments with two bits per memory cell and four data states. Therefore, the verify process includes a verify pulse at Vva, a verify pulse at Vvb and a verify pulse a Vvc. In embodiments with three bits per memory cell and eight data states, there may be up to eight verify pulses. Note that some embodiments will use less than all three or eight verify pulses in some iterations when it is clear that no memory cell needs to be tested for certain data states. Additionally, embodiments with different numbers of data states will use different numbers of verify pulses. In the embodiment of FIG. 14, the verify operations (step 674) and the counting the failed cells (step 680) are performed between programming pulses. Therefore, as soon as it is determined that all memory cells have verified or that the number of memory cells that failed verification is less than the predetermined limit (or a limit that is not predetermined), than the programming process can stop without applying the next programming pulse.

Figure 15:
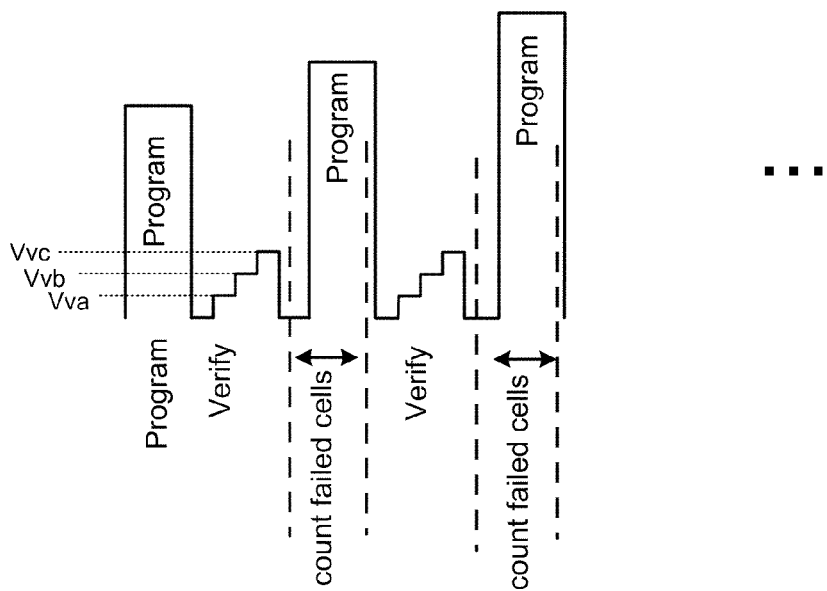

FIG. 15 shows a portion of another embodiment of the voltage waveform applied to the selected word line and, therefore, to the control gates of the memory cells connected to the selected word line during the programming process of FIG. 13. This waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. In the embodiment of FIG. 15, the verify operations (step 674) are performed between programming pulses. However, the counting of the failed cells is performed during the next program pulse, which can save time. When it is determined that all memory cells have verified or that the number of memory cells that failed verification is less than the predetermined limit (or a limit that is not predetermined), than the programming process can stop; however, the next programming pulse has already been applied. As discussed above, the results of the verification process can be stored in latches 494. These latches can be read during the next program pulse.

Figure 16:
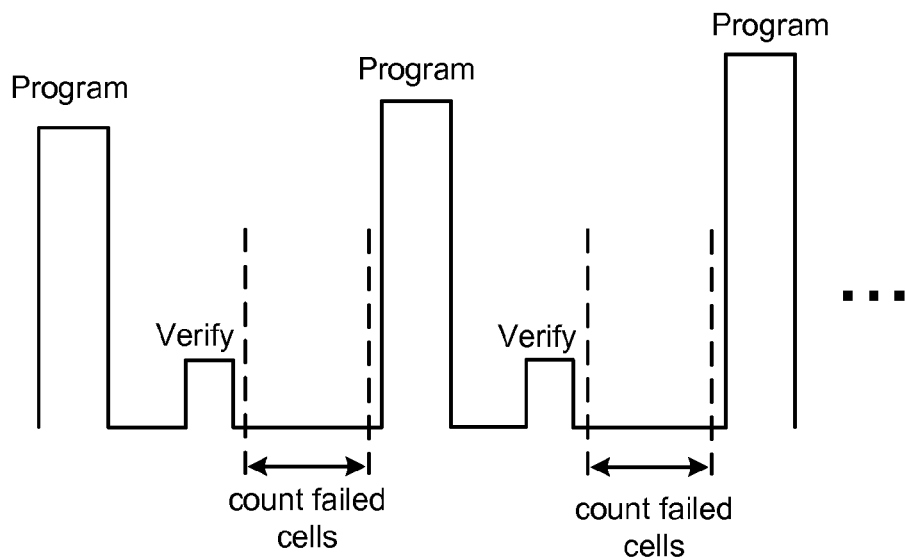

FIG. 16 shows a portion of another embodiment of the voltage waveform applied to the selected word line and, therefore, to the control gates of the memory cells connected to the selected word line. This waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. The embodiment of FIG. 16 pertains to a programming process that is only verifying for one state. For example, when programming data to four, eight or more states, the process may reach a condition where the memory cells have all reached their target states except for the memory cells being programmed to the highest state (e.g., state C or state S7). At that point, the verify process will only perform a verify at Vvc (see FIG. 6) or Vv7 (see FIG. 7). Thus, FIG. 16 only shows on verify pulse for testing whether the memory cells the highest data state (or another state that is not the highest). In another example, the waveform of FIG. 16 can be used with a programming operation that is only programming to one state; for example, the first phase of the process of FIG. 7, the process of FIG. 8A, the process of FIG. 11A or other processes. For programming operations that program to more than one state, the additional verify pulses can be added to the waveform, as appropriate. In the embodiment of FIG. 16, the verify operations (step 674) and the counting the failed cells (step 680) are performed between programming pulses.

Figure 17:
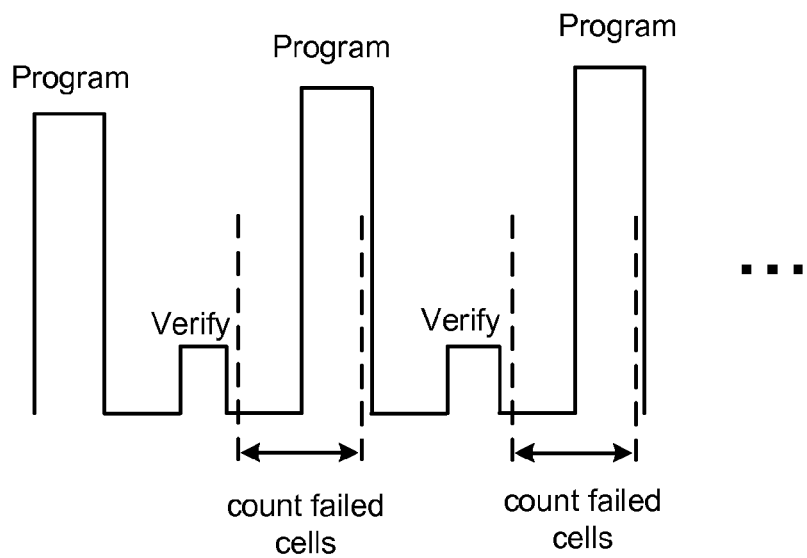

FIG. 17 shows a portion of another embodiment of the voltage waveform applied to the selected word line and, therefore, to the control gates of the memory cells connected to the selected word line. This waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. Like FIG. 16, the waveform of FIG. 17 pertains to a programming process that is only verifying for one state. In the embodiment of FIG. 17, the verify operations (step 674) are performed between programming pulses. However, the counting of the failed cells is performed during the next program pulse.

Because the program voltage is applied to all memory cells connected to a word line, an unselected memory cell (a memory cell that is not to be programmed) on the word line may become inadvertently programmed. The unintentional programming of the unselected cell on the selected word line is referred to as "program disturb." For example, a memory cell in state E may have its threshold voltage increased to a level outside of state E. FIG. 18 shows threshold voltage versus number of memory cells for data states E, A, B and C for a population of memory cells during a programming process. State E is depicted as having a subset of its memory cells, indicated by shaded region 702, being subjected to program disturb so that their respective threshold voltage is above the level normally intended to be part of state E. The program disturb is more severe when programming memory cells to the highest (most extreme) state (e.g. state C or S7). This is because it generally takes more voltage pulses to program memory cells to the highest state and the more pulses applied increases the chance of program disturb. Furthermore, since the magnitude of the voltage increases with each pulse, the highest data state is programmed with higher voltages, which also can increase the chance of program disturb.

FIG. 18 also shows that some of the memory cells (see shaded region 704) that are being programmed to highest state C have not yet reached Vvc. In this case, continuing to program the memory cells represented by shaded region 704 will only exacerbate the program disturb of the memory cells in shaded region 702. Therefore, the programming process described above stops the programming of memory cells to the highest state (and other data states) before all memory cells have reached the target (e.g., have reached Vvc) in order to reduce (or prevent further exacerbation) of the program disturb. However, the programming is only stopped when the number of memory cells not fully programmed is less than the number of cells that can be corrected by ECC, as explained above with respect to steps 680 and 682 of FIG. 13.

In one embodiment, instead of counting the number of cells that are below the verify compare value (e.g., Vvc), the system can count the number of cells that are below an intermediate compare value and use that count as an estimate of how many cells are below the verify compare value. For example, FIG. 19 shows the threshold voltage distribution for data state C with verify compare value Vvc and read compare value Vrc. FIG. 19 also shows an intermediate compare value VvcL. In one embodiment of step 680 of FIG. 13, the system will count the number of memory cells supposed to be programmed to state C that have their threshold voltage less than VvcL in order to estimate the number of memory cells supposed to be programmed to state C that have their threshold voltage less than Vvc.

The number of memory cells that have their threshold voltage less than VvcL is proportional to the number of memory cells that have their threshold voltage less than Vvc. For example, if VvcL is 0.4-0.5v lower than Vvc, than the number of memory cells that have their threshold voltage less than VvcL is approximately one tenth (1/10) of the number of memory cells that have their threshold voltage less than Vvc. If VvcL is 0.8-1.0v lower than Vvc, than the number of memory cells that have their threshold voltage less than VvcL is approximately one hundredth (1/100) of the number of memory cells that have their threshold voltage less than Vvc. In some implementations, the number of cells that are counted as being below the compare value will reduce with a factor of 10 for each 0.4-0.5v. FIG. 19 shows shaded region 712 representing those memory cells with a threshold voltage below Vvc and above Vrc. Shaded region 714 represents those memory cells with a threshold voltage below Vrc and above VvcL. Shaded region 714 represents those memory cells with a threshold voltage below VvcL. Thus, the number of memory cells that have their threshold voltage less than Vvc is the sum of shaded regions 712+714+716. As can be seen this is significantly larger than the number of memory cells that have their threshold voltage less than VvcL. In some embodiments, counting the number of memory cells below the intermediate compare value VvcL will be faster than counting the number of memory cells below Vvc.

Figure 20:
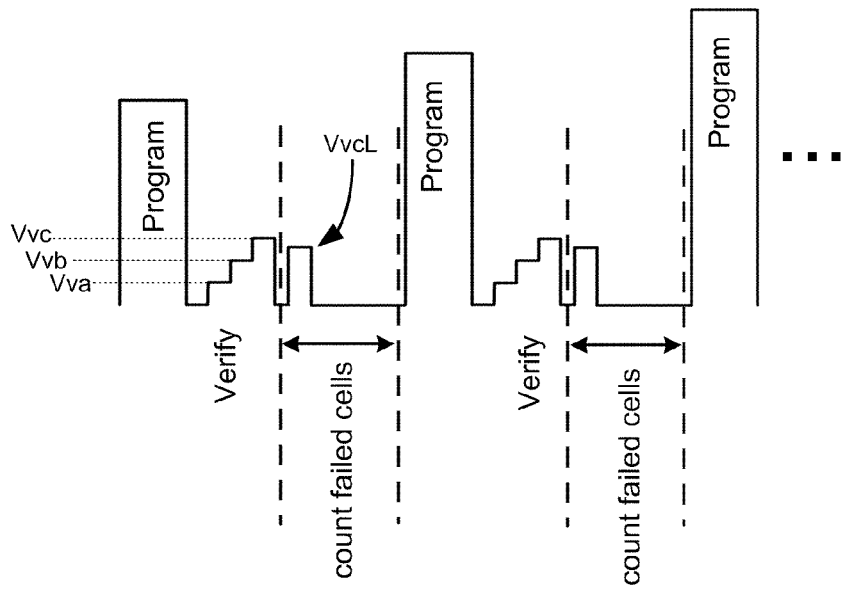
FIGS. 20-23 depicts a control gate signal for one embodiment of non-volatile memory.

FIG. 20 shows a portion of the voltage waveform applied to the selected word line (and, therefore, to the control gates of the memory cells connected to the selected word line) during the programming process of FIG. 13 for the embodiment of step 680 in which the system will count the number of memory cells supposed to be programmed to state C that have their threshold voltage less than intermediate compare value VvcL. If the number of memory cells supposed to be programmed to state C that have their threshold voltage less than VvcL is less than or equal to a particular limit (see step 682 of FIG. 13), then the programming process is concluded. Since VvcL is lower than Vvc, the particular limit compared against is lower than if comparing against Vvc. In the two examples above, the limit used for VvcL is 10 or 100 times smaller than the limit used for Vvc. The waveform of FIG. 20 shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. In this embodiment, step 680 (count failed cells) includes applying a voltage pulse of VvcL in order to test whether the memory cells have a threshold voltage of at least VvcL. Other methods of testing the threshold voltage can also be used. Additionally note that although the voltage pulse is depicted as a perfect square wave, in reality the voltage pulse (and the other pulses depicted in this figure and other figures) is not likely to be a perfect square and in some cases it may be a different shape than a square wave.

The example of FIG. 20 corresponds to the embodiments with two bits per memory cell and four data states. Therefore, the verify process includes a verify pulse at Vva, a verify pulse at Vvb and a verify pulse a Vvc. In embodiments with three bits per memory cell and eight data states, there may be up to eight verify pulses. Note that some embodiments will use less than all three or eight verify pulses in some iterations when it is clear that no memory cell needs to be tested for certain data states. Additionally, embodiments with different numbers of data states will use different numbers of verify pulses. In the embodiment of FIG. 20, the verify operations (step 674) and the counting the failed cells (step 680) are performed between programming pulses. Therefore, as soon as it is determined that all memory cells have verified or that the number of memory cells that failed verification is less than a limit, than the programming process can stop without applying the next programming pulse.

Figure 21:
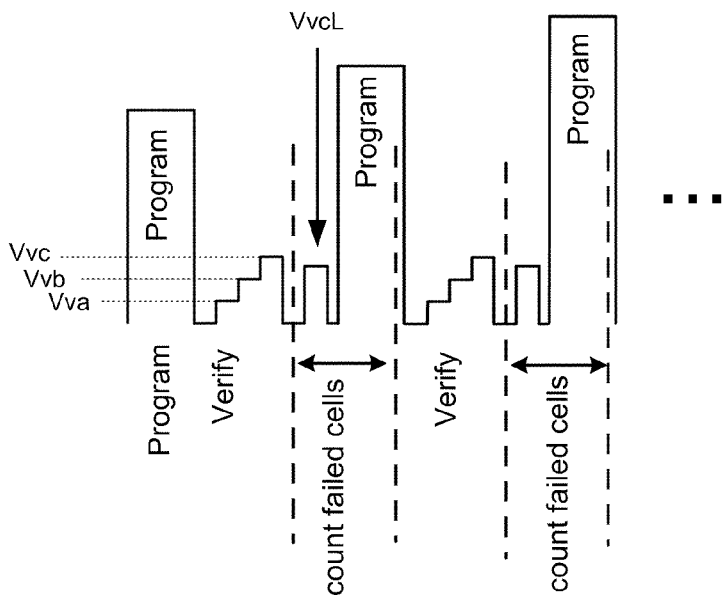

FIG. 21 shows a portion of the voltage waveform applied to the selected word line (and, therefore, to the control gates of the memory cells connected to the selected word line) for another embodiment of step 680 of FIG. 13, in which the system will count the number of memory cells supposed to be programmed to state C that have their threshold voltage less than VvcL. This waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. In this embodiment, step 680 (count failed cells) includes applying a voltage pulse of VvcL in order to test whether the memory cells have a threshold voltage of at least VvcL. Other methods of testing the threshold voltage can also be used. In the embodiment of FIG. 21, the verify operations (step 674) are performed between programming pulses. However, the counting of the failed cells (step 680) is performed during the next program pulse. As discussed above, the results of the verification process can be stored in latches 494. These latches can be read during the next program pulse.

Figure 22:
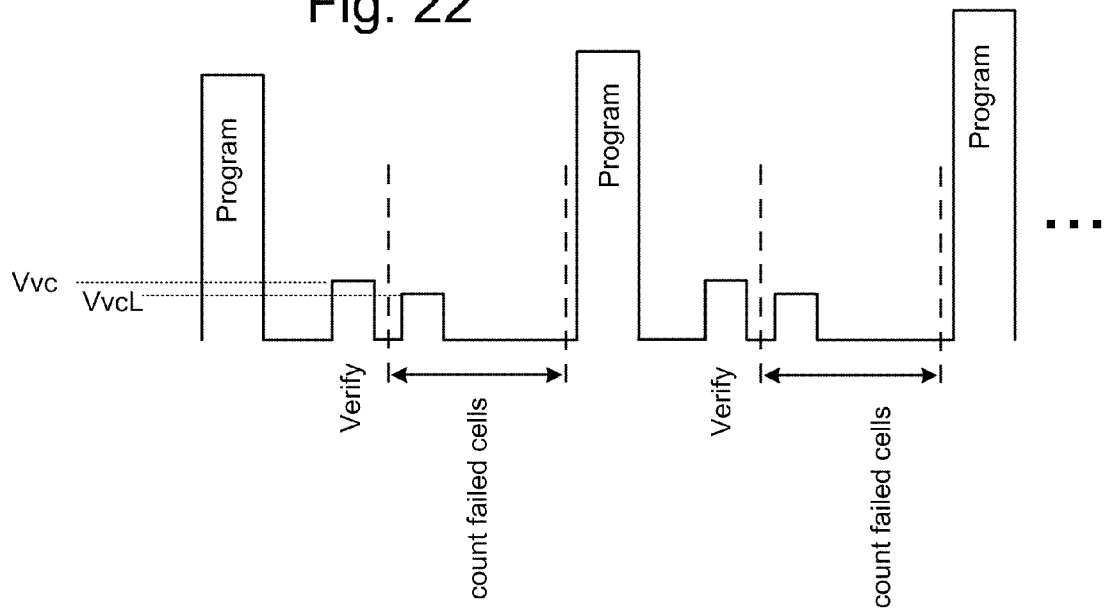

FIG. 22 shows a portion of the voltage waveform applied to the selected word line (and, therefore, to the control gates of the memory cells connected to the selected word line) for another embodiment of step 680 of FIG. 13, in which the system will count the number of memory cells supposed to be programmed to state C that have their threshold voltage less than VvcL. This waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. The embodiment of FIG. 16 pertains to a programming process that is only verifying for one state. For example, when programming data to four, eight or more states, the process may reach a condition where the memory cells have all reached their target states except for the memory cells being programmed to the highest state (e.g., state C or state S7). At that point, the verify process will only perform a verify at Vvc (see FIG. 6) or Vv7 (see FIG. 7). Thus, FIG. 22 only shows one verify pulse for testing whether the memory cells reached the highest data state (or another state that is not the highest). The waveform of FIG. 22 can be used with a programming operation that is only programming to one state; for example, the first phase of the process of FIG. 7, the process of FIG. 8A, the process of FIG. 11A or other processes. For programming operations that program to more than one state, the additional verify pulses can be added to the waveform, as appropriate. In the embodiment of FIG. 22, the verify operations (step 674) and the counting the failed cells (step 680) are performed between programming pulses. In this embodiment, like the embodiment of FIG. 21, step 680 (count failed cells) includes applying a voltage pulse of VvcL in order to test whether the memory cells have a threshold voltage of at least VvcL. Other methods of testing the threshold voltage can also be used.

Figure 23:
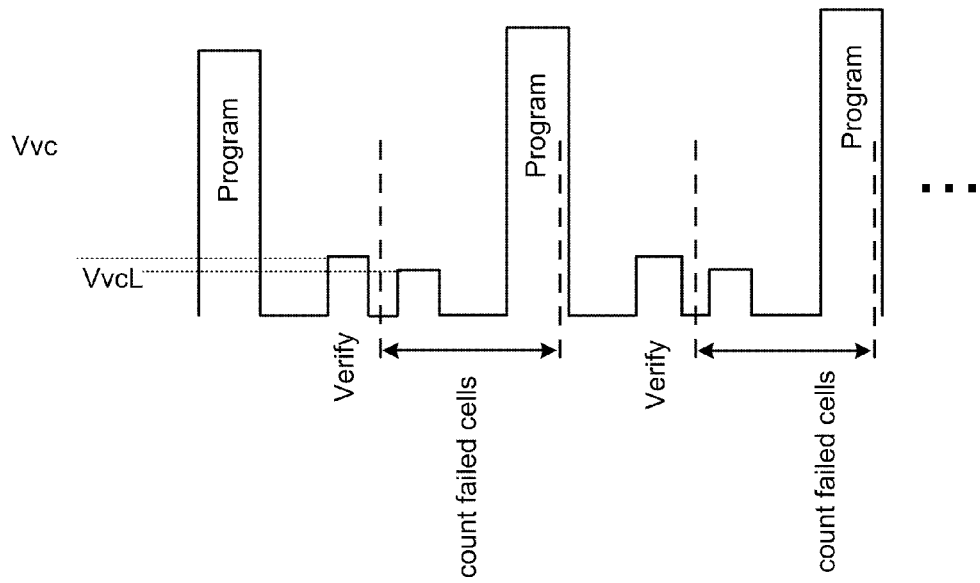

FIG. 23 shows a portion of the voltage waveform applied to the selected word line (and, therefore, to the control gates of the memory cells connected to the selected word line) for another embodiment of step 680 of FIG. 13, in which the system will count the number of memory cells supposed to be programmed to state C that have their threshold voltage less than VvcL. This waveform shows the programming pulse (Program) applied during step 672, the verify pulses (Verify) applied during step 674 and the time period (count failed cells) for counting the failed cells during step 680 for parts of three iterations of the loops comprising steps 672-686 of FIG. 13. Like FIG. 22, the waveform of FIG. 23 pertains to a programming process that is only verifying for one state. In the embodiment of FIG. 23, the verify operations (step 674) are performed between programming pulses. However, the counting of the failed cells (count failed cells) of step 680 is performed during the next program pulse. In this embodiment, like the embodiment of FIG. 21, step 680 (count failed cells) includes applying a voltage pulse of VvcL in order to test whether the memory cells have a threshold voltage of at least VvcL. In one embodiment, the voltage pulse of VvcL is applied prior to the next program pulse while the counting of failed cells is performed concurrently with the next program pulse. Other methods of testing the threshold voltage can also be used.

FIGS. 20-23 describe the use of a intermediate compare level (e.g., VvcL) when performing step 680 for memory cells being programmed to state C. In one set of embodiments, step 680 will be performed on memory cells being programmed to states other than state C (which is the highest state, or most extreme state) by counting the number of memory cells that have not reached the respective verify compare levels (e.g. Vva and Vvb). Thus, programming to state A will stop when less than a first predetermined number of memory cells intended to be programmed to state A have not reached Vva, programming to state B will stop when less than a second predetermined number (may be the same or different than the first predetermined number) of memory cells intended to be programmed to state B have not reached Vvb, and programming to state C will stop when less than a first predetermined number of memory cells intended to be programmed to state C have not reached VvcL.

In another set of embodiment, step 680 and 682 will only be performed by memory cells being programmed to the highest, or most extreme, state (e.g. state C or state S7).

In another set of embodiments, step 680 will use a intermediate compare value for each state. For example, step 680 will use an intermediate compare value for memory cells being programmed to state A that is lower than Vva and step 680 will use an intermediate compare value for memory cells being programmed to state B that is lower than Vvb.

In some embodiments, such as where the threshold voltages are lowered for programming and raised during erase, the intermediate compare value will be higher than the verify compare value.

FIGS. 20-23 illustrate the use of an intermediate compare level (e.g., VvcL) with memory cells that store two bits of data. However, the concepts taught by FIGS. 20-23 can be applied to memory cells that store more than two bits of data. For example, counting memory cells that have a threshold voltage less than the intermediate value in step 680 can be used with the programming processes of FIGS. 10 and 11. In one example that includes memory cells storing three bits of data, step 680 will count memory cells that have threshold voltages less than the respective verify levels for S1-S6 (e.g., Vv1, Vv2, Vv3, Vv4, Vv5, Vv6) for memory cells being programmed to S1-S6 and count memory cells that are less than Vv7L for memory cells being programmed to state S7, where Vv7L is 0.5v (or a different value) less than Vv7. In one alternative, Vv7L can be equal to Vv6, Vv5 or another value near those values.

In another example that includes memory cells storing three bits of data, step 680 will count memory cells that have threshold voltages less than the respective verify levels for S1-S5 (e.g., Vv1, Vv2, Vv3, Vv4, and Vv5) for memory cells being programmed to S1-S5, count memory cells that are less than Vv6L for memory cells being programmed to state S6, and count memory cells that are less than Vv7L for memory cells being programmed to state S7, where Vv6L is 0.5v (or a different value) less than Vv6.

Figure 24:
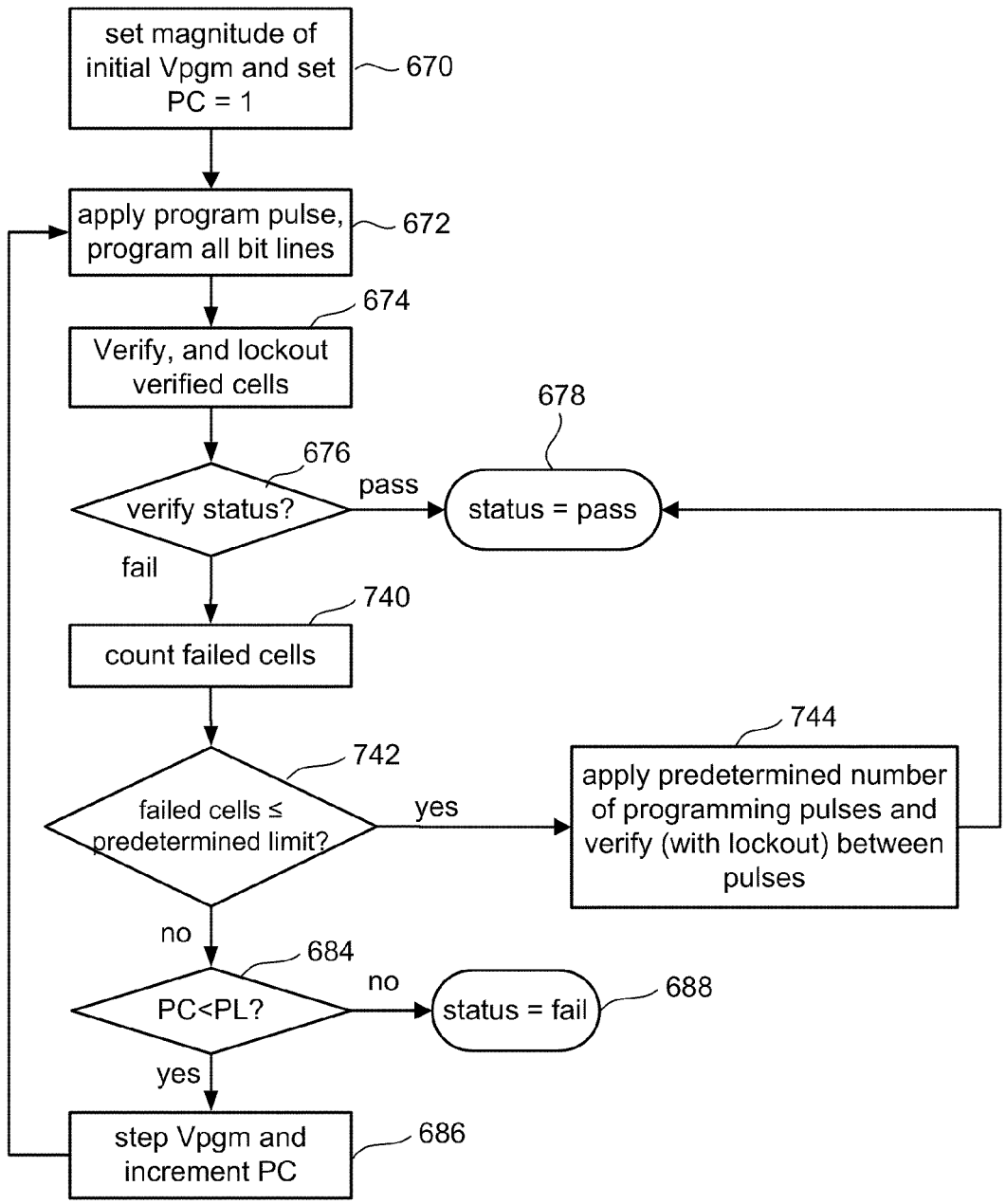
FIG. 24 is a flow chart describing one embodiment of a process for programming non-volatile memory.

FIG. 24 describes another embodiment where VvcL is set to be equal to Vvb, or Vv7L is set to be Vv6. Additionally, after determining that the number of failed cells (e.g., cells having a threshold voltage that is less the intermediate compare value) is less than the predetermined number, a predetermined number of one or more additional programming pulses is applied. In the embodiments that perform step 680 during the next program pulse (see FIGS. 21 and 23), the predetermined number of one or more additional programming pulses are applied after the next program pulse. The process of FIG. 24 is similar to the process of FIG. 13 (with like reference numbers depicting the same steps); however, steps 680 and 682 are replaced by steps 740-744. Step 740 is similar to step 680 except that VvcL=Vvb or Vv7L=Vv6. Step 742 is similar to step 682, except the predetermined limit compared to the failed cells may be different. If the number of failed cells is greater than the predetermined limit, than the process continues at step 684. If the number of failed cells is less than or equal to the predetermined limit, than the process continues at step 744. In step 744, a predetermined number of programming pulses are applied to the memory cells via the selected word line. Verify operations (with lockout for memory cells that verify successfully) are performed between these predetermined number of programming pulses. The predetermined limit and the predetermined number of programming pulses can be determined based on simulation or device characterization. In one embodiment, the limit and the number of programming pulses are set dynamically based on number of program-erase cycles, temperature or other factors, rather than be predetermined.

Figure 25:
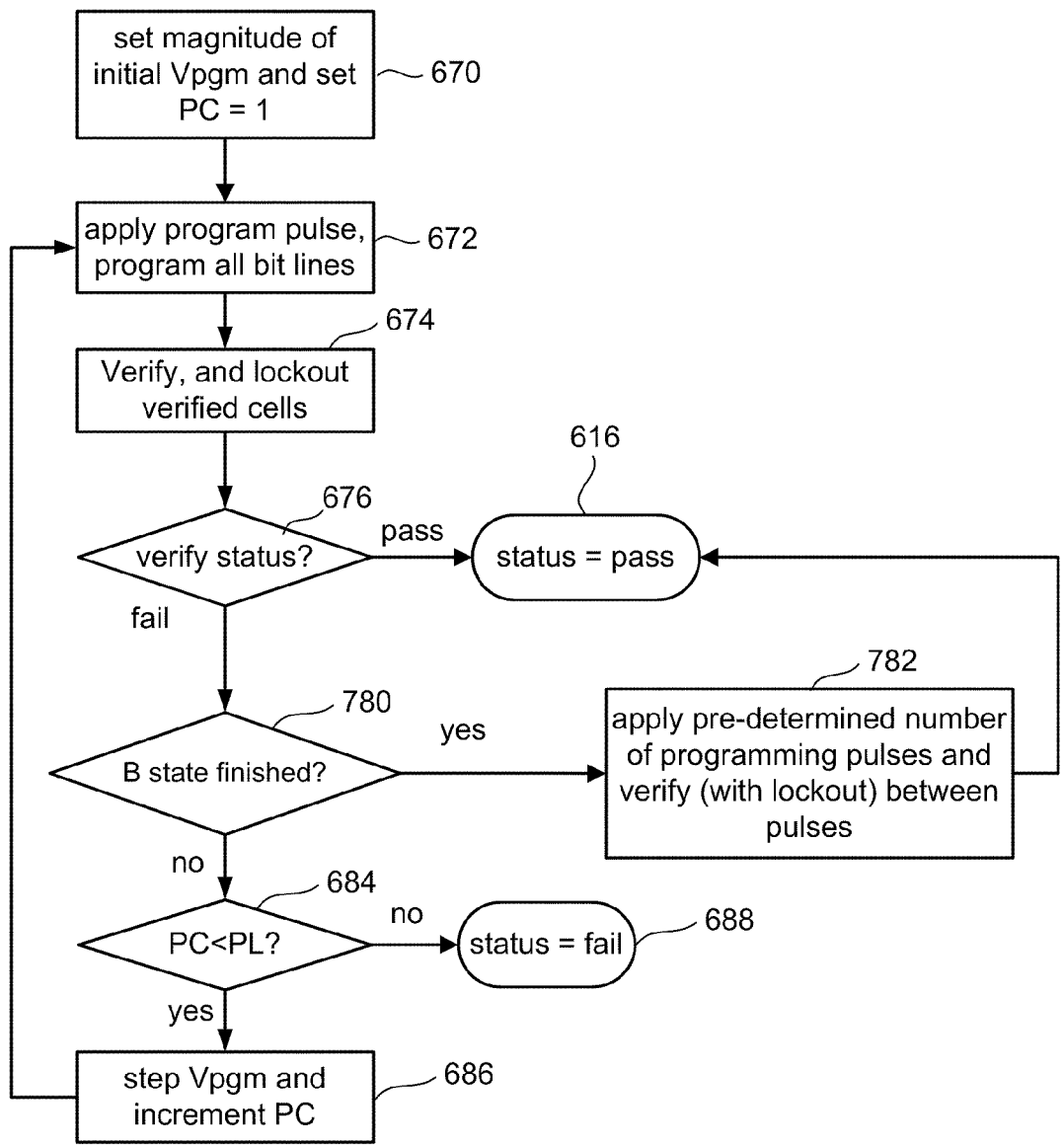
FIG. 25 is a flow chart describing one embodiment of a process for programming non-volatile memory.

FIG. 25 describes another embodiment that includes applying a predetermined number of programming pulses and concluding the programming after all memory cells intended to be programmed to state B have sufficiently been programmed to state B. It is assumed that when after all memory cells intended to be programmed to state B have sufficiently been programmed to state B, that a small number of memory cells intended to be programmed to state C do not yet have threshold voltages that have reached Vvb. The phrase "sufficiently programmed" means that enough memory cells have reached state B to consider the programming process successful. For example, when programming a group of memory cells to state B using the process of FIG. 13, the group of memory cells are sufficiently programmed when enough memory cells have successfully verified such that the number of memory cells that have failed verification is less than predetermined limit (e.g., the predetermined limit that can be fixed with ECC). At this point, it is assumed that less than the predetermined limit of memory cells intended to be programmed to state C would have failed verification for state B if so tested. Therefore, only apply a predetermined additional set of one or more programming pulses and then stop the programming. When applying the additional set of one or more programming pulses (in this embodiment or the embodiment of FIG. 24), there will be no counting failed cells during or between the additional set of one or more programming pulses. To achieve this embodiment, the memory cells being programmed to state C will perform the process of FIG. 25, while the memory cells being programmed to states A and B will perform the process of FIG. 13.

The process of FIG. 25 is similar to the process of FIG. 13, with the following exceptions. If, in step 676, it is determined that not all memory cells have been properly verified, then in step 780 it is determined whether all memory cells intended to be programmed to state B have sufficiently been programmed to state B. If not, the process continues at step 684. If all memory cells intended to be programmed to state B have sufficiently been programmed to state B, then in step 782 a predetermined number of programming pulses are applied to the memory cells via the selected word line. Verify operations (with lockout for memory cells that verify successfully) are performed between these predetermined number of programming pulses. The number of programming pulses are applied to the memory cells during step 782 can be determined based on experimentation, simulation and/or device characterization. The amount of the increment between programming pulses may affect the number of programming pulses that are applied to the memory cells during step 782.

The embodiment of FIG. 25 can also be used with memory cells storing more than two bits of data. For example, the process of FIG. 25 can be used with memory cells being programmed as depicted in FIGS. 10 and 11H, as well as other programming processes. In one embodiment, when using the process of FIG. 25 with memory cells storing three bits of data, step 780 test whether all memory cells intended to be programmed to state S6 (the second highest state) have sufficiently been programmed to state S6.

One solution for achieving tight threshold voltage distributions, without unreasonably slowing down the programming process, includes using a two-phase programming process. The first phase, a coarse programming phase, includes an attempt to raise a threshold voltage in a faster manner and paying less attention to achieving a tight threshold voltage distribution. The second phase, a fine programming phase, attempts to raise the threshold voltage in a slower manner in order to reach the target threshold voltage, while also achieving a tighter threshold voltage distribution. One example of a coarse/fine programming methodology can be found in U.S. Pat. No. 6,643,188, incorporated herein by reference in its entirety.

FIGS. 26A-C and 27A-C provide more detail of one example of a coarse/fine programming methodology. FIGS. 26A and 27A depict the programming pulses Vpgm applied to the control gate. FIGS. 26B and 27B depict the bit line voltages for the memory cells being programmed. FIGS. 26C and 27C depict the threshold voltage of the memory cells being programmed. This example uses two verify levels, indicated in the Figures as Vver1 and Vver2. The final target level is Vver1. When a threshold voltage of the memory cell has reached Vver1, the memory cell will be inhibited from further programming by applying an inhibit voltage to the bit line corresponding to that memory cell. For example, the bit line voltage can be raised to Vinhibit (See FIG. 26B and FIG. 27B). In one embodiment, Vinhibit is Vdd. However, when a memory cell has reached a threshold voltage close to (but lower than) the target value Vver1, the threshold voltage shift to the memory cell during subsequent programming pulses is slowed down by applying a certain bias voltage to the bit line, typically in the order of 0.3v to 0.8v. Because the rate of threshold voltage shift is reduced during the next few programming pulses, the final threshold voltage distribution can be narrower than otherwise. To implement this method, a second verify level that is lower than that of Vver1 is used. This second verify level is depicted as Vver2. When the threshold voltage of the memory cell is larger than Vver2, but still lower than Vver1, the threshold voltage shift to the memory cell will be reduced for subsequent programming pulses by applying a bit line bias Vs (FIG. 27B). Note that in this case, two verify operations are required for each state. One verify operation at the corresponding Vver1 for each state, and one verify operation at the corresponding Vver2 for each state. This may increase the total time needed to program the memory cells. However, a larger ΔVpgm step size can be used to speed up the process.

FIGS. 26A, 26B, and 26C show the behavior of a memory cell whose threshold voltage moves past Vver2 and Vver1 in one programming pulse. For example, the threshold voltage is depicted in FIG. 26C to pass Vver2 and Vver1 in between t2 and t3. Thus, prior to t3, the memory cell is in the coarse phase. After t3, the memory cell is in the inhibit mode.

FIGS. 27A, 27B, and 27C depict a memory cell that enters both the coarse and fine programming phases. The threshold voltage of the memory cell crosses Vver2 in between time t2 and time t3. Prior to t3, the memory cell is in the coarse phase. After t3, the bit line voltage is raised to Vs; therefore, the memory cell is in the fine phase. In between t3 and t4, the threshold voltage of the memory cell crosses Vver1; therefore, the memory cell is inhibited from further programming by raising the bit line voltage to Vinhibit.

The technology described above with respect to stopping programming when an estimated number of memory cells that have failed verification is less than a limit can be used with the coarse/fine programming described with respect to FIGS. 26A-C and 27A-C (or a different type of coarse/fine programming). The intermediate value used to estimate the number of memory cells that have failed verification can be Vver2.

One embodiment includes applying a programming signal to a first set of non-volatile storage elements in order to program the first set of non-volatile storage elements to a first target condition, determining whether the amount of non-volatile storage elements of the first set that have not yet reached an intermediate condition is less than a compare value, and concluding programming of the first set of non-volatile storage elements in response to determining that the amount of non-volatile storage elements of the first set that have not yet reached the intermediate condition is less than the compare value. The intermediate condition is different than the first target condition.

One embodiment includes a first set of non-volatile storage elements and one or more managing circuits in communication with the first set of non-volatile storage elements. The one or more managing circuits perform a programming process on the first set of non-volatile storage elements to program the first set of non-volatile storage elements to a first target condition. The programming process includes the one or more managing circuits applying a programming signal to the first set of non-volatile storage elements and verifying whether the first set of non-volatile storage elements have reached the first target condition. The one or more managing circuits determine a number of non-volatile storage elements of the first set that have not yet reached an intermediate condition during the programming process. The intermediate condition is different than the first target condition. The one or more managing circuits conclude the programming process for the first set of non-volatile storage elements if the number of non-volatile storage elements of the first set that have not yet reached the intermediate condition is less than the compare value.

One embodiment includes applying a programming signal to a plurality of non-volatile storage elements in order to concurrently program the non-volatile storage elements to different target conditions, verifying whether the non-volatile storage elements have reached their respective target conditions, counting non-volatile storage elements of the first subset that have not yet reached an intermediate condition with respect to the highest target condition, and concluding programming of the non-volatile storage elements in response to counting less than a predetermined number of the non-volatile storage elements of the first subset to have not yet reached the intermediate condition and determining that other non-volatile storage elements intended for other target conditions of the different target conditions are sufficiently programmed. Non-volatile storage elements reaching the highest target condition pass through the intermediate condition. The different target conditions include a lowest target condition and a highest target condition. The programming signal includes a set of pulses. The plurality of non-volatile storage elements includes a first subset of non-volatile storage elements being programmed to the highest target condition. The verifying includes performing one or more verifying processes between pulses.

One embodiment includes applying a programming signal to a plurality of non-volatile storage elements in order to program the non-volatile storage elements to different target conditions. The programming signal includes a set of pulses. The different target conditions include a first target condition and a second target condition. The plurality of non-volatile storage elements includes a first subset of non-volatile storage elements being programmed to the first target condition and a second subset of non-volatile storage elements being programmed to the second target condition. The method further comprises verifying whether the second subset of non-volatile storage elements have sufficiently reached the second target condition, applying a predetermined number of one or more pulses to the first subset of non-volatile storage elements in response to determining that the second subset of non-volatile storage elements have sufficiently reached the second target condition, and concluding programming of the first subset of non-volatile storage elements in response to and after applying the predetermined number of one or more pulses to the first subset of non-volatile storage elements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A method of programming non-volatile storage, comprising:
applying a programming signal to a first set of non-volatile storage elements in order to program the first set of non-volatile storage elements to a first target condition;
determining whether the amount of non-volatile storage elements of the first set that have not yet reached an intermediate condition is less than a compare value, the intermediate condition is different than the first target condition; and
concluding programming of the first set of non-volatile storage elements in response to determining that the amount of non-volatile storage elements of the first set that have not yet reached the intermediate condition is less than the compare value.

2. The method of claim 1, further comprising:
verifying whether the first set of non-volatile storage elements have reached the first target condition.

3. The method of claim 2, wherein:
the programming signal includes a set of pulses;
the verifying includes performing one or more verifying processes between pulses; and
the determining includes counting non-volatile storage elements of the first set that have not yet reached the intermediate condition during at least some of the pulses.

4. The method of claim 2, wherein:
the programming signal includes a set of pulses;
the verifying includes performing one or more verifying processes between pulses; and
the determining includes counting non-volatile storage elements of the first set that have not yet reached the intermediate condition between pulses.

5. The method of claim 1, wherein:
the first target condition is a threshold voltage range; and
the intermediate condition is a threshold voltage level that is a lower voltage level than the first target condition.

6. The method of claim 1, wherein the determining whether the amount of non-volatile storage elements of the first set that have not yet reached an intermediate condition is less than a compare value comprises:
counting non-volatile storage elements of the first set that have not yet reached the intermediate condition; and comparing the number of non-volatile storage elements counted to a predetermined value.

7. The method of claim 1, wherein:
the amount of non-volatile storage elements of the first set that have not yet reached the intermediate condition is proportional to how many non-volatile storage elements of the first set have not yet reached the target condition.

8. The method of claim 1, wherein:
the applying of a program signal is part of a programming process that programs a plurality of non-volatile storage elements to different target conditions, the different target conditions include a lowest target condition and a highest target condition, the plurality of non-volatile storage elements include the first set of non-volatile storage elements, the first target condition is the highest target condition.

9. The method of claim 1, wherein:
the applying of a program signal concurrently programs a plurality of non-volatile storage elements to different target conditions, the different target conditions include a lowest target condition and a highest target condition, the plurality of non-volatile storage elements include the first set of non-volatile storage elements, the first target condition is the highest target condition; and
the process further includes verifying whether the first set of non-volatile storage elements have reached the first target condition.

10. The method of claim 1, wherein:
the process further includes verifying whether the first set of non-volatile storage elements have reached the first target condition, the verifying includes performing one or more verifying processes between at least a subset of the pulses;
the programming signal includes a set of pulses;
the first target condition is a threshold voltage range;
the intermediate condition is a threshold voltage level that is a lower voltage level than the first target condition; and
the determining whether the amount of non-volatile storage elements of the first set that have not yet reached an intermediate condition is less than a compare value comprises counting non-volatile storage elements of the first set that have not yet reached the intermediate condition and comparing the number of non-volatile storage elements counted to a predetermined value.

11. The method of claim 1, wherein:
the first set of non-volatile storage elements are associated with a set of data states, the first target condition is one of the set of data states, the intermediate condition is a verify value for a different data state of the set of data states.

12. The method of claim 1, wherein:
the programming signal includes a set of pulses;
the first set of non-volatile storage elements are associated with a set of data states, the first target condition is one of the set of data states, the intermediate condition is a verify value for a different data state of the set of data states;
the method further includes applying a predetermined number of one or more pulses to the first set of non-volatile storage elements in response to determining that the amount of non-volatile storage elements of the first set that have not yet reached the intermediate condition is less than the compare value; and
the programming of the first set of non-volatile storage elements is concluded after the applying the predetermined number of one or more pulses to the first set of non-volatile storage elements.

13. The method of claim 1, wherein:
the first set of non-volatile storage elements are multi-state flash memory devices.

14. A method of programming non-volatile storage, comprising:
applying a programming signal to a plurality of non-volatile storage elements in order to concurrently program the non-volatile storage elements to different target conditions, the different target conditions include a lowest target condition and a highest target condition, the programming signal includes a set of pulses, the plurality of non-volatile storage elements includes a first subset of non-volatile storage elements being programmed to the highest target condition;
verifying whether the non-volatile storage elements have reached their respective target conditions, the verifying includes performing one or more verifying processes between pulses;
counting non-volatile storage elements of the first subset that have not yet reached an intermediate condition with respect to the highest target condition, non-volatile storage elements reaching the highest target condition pass through the intermediate condition; and
concluding programming of the non-volatile storage elements in response to counting less than a predetermined number of the non-volatile storage elements of the first subset to have not yet reached the intermediate condition and determining that other non-volatile storage elements intended for other target conditions of the different target conditions are sufficiently programmed.

15. The method of claim 14, wherein:
the counting is performed during pulses.

16. The method of claim 14, wherein:
the counting is performed between pulses.

17. The method of claim 14, further comprising:
applying a predetermined number of one or more pulses to the first subset of non-volatile storage elements in response to counting less than the predetermined number of the non-volatile storage elements of the first subset to have not yet reached the intermediate condition, the concluding programming is performed after the applying the predetermined number of one or more pulses.

18. The method of claim 14, wherein:
the first set of non-volatile storage elements are multi-state flash memory devices.

19. A method of programming non-volatile storage, comprising:
applying a programming signal to a plurality of non-volatile storage elements in order to program the non-volatile storage elements to different target conditions, the programming signal includes a set of pulses, the different target conditions include a first target condition and a second target condition, the plurality of non-volatile storage elements includes a first subset of non-volatile storage elements being programmed to the first target condition and a second subset of non-volatile storage elements being programmed to the second target condition;
verifying whether the second subset of non-volatile storage elements have sufficiently reached the second target condition;
applying a predetermined number of one or more pulses to the first subset of non-volatile storage elements in response to determining that the second subset of non-volatile storage elements have sufficiently reached the second target condition; and concluding programming of the first subset of non-volatile storage elements in response to and after applying the predetermined number of one or more pulses to the first subset of non-volatile storage elements.

20. The method of claim 19, wherein:
the first subset of non-volatile storage elements and the second subset of non-volatile storage elements are multi-state flash memory devices connected to a common word line.

21. The method of claim 19, wherein:
the verifying is performed multiple times, each time between a pair of consecutive pulses; and
the different target conditions are threshold voltage ranges.

22. The method of claim 19, wherein:
the applying the programming signal to the plurality of non-volatile storage elements concurrently programs the first subset of non-volatile storage elements and the second subset of non-volatile storage elements.

23. The method of claim 19, wherein:
the first target condition is a higher threshold voltage range; and
the second target condition is a lower threshold voltage range.

* * * * *